(12) United States Patent
Laming et al.

(10) Patent No.: US 7,856,804 B2
(45) Date of Patent: Dec. 28, 2010

(54) MEMS PROCESS AND DEVICE

(75) Inventors: Richard I. Laming, Edinburgh (GB);
Mark Begbie, Edinburgh (GB);
Anthony Traynor, Livingston (GB)

(73) Assignee: Wolfson Microelectronics plc, Edinburgh (GB)

(*) Notice: Subject to any disclaimer, the term of this patent is extended or adjusted under 35 U.S.C. 154(b) by 0 days.

(21) Appl. No.: 12/719,999

(22) Filed: Mar. 9, 2010

(65) Prior Publication Data

US 2010/0155864 A1 Jun. 24, 2010

Related U.S. Application Data

(62) Division of application No. 11/723,514, filed on Mar. 20, 2007, now Pat. No. 7,781,249.

(30) Foreign Application Priority Data

Mar. 20, 2006 (GB) .................. 0605576.8

(51) Int. Cl.
  *H01L 29/34* (2006.01)
(52) U.S. Cl. .......... 57/416; 257/415; 257/419; 257/E21.001; 257/E21.526; 257/E29.324
(58) Field of Classification Search .......... 257/415, 257/416, 419, E21.001, E21.526, E29.324
See application file for complete search history.

(56) References Cited

U.S. PATENT DOCUMENTS 5,389,182 A 2/1995 Mignardi
5,452,268 A 9/1995 Bernstein
5,573,679 A 11/1996 Mitchell et al.
6,146,543 A 11/2000 Tai et al.

(Continued)

FOREIGN PATENT DOCUMENTS

EP 056 1 566 9/1993

(Continued)

OTHER PUBLICATIONS

M. Pedersen et al. "A Polymer Condenser Microphone on Silicon With On-Chip CMOS Amplifier", Transducers '97, International Conf. on Solid-State Sensors and Actuators, Digest of Technical Papers, pp. 445-446, 1997.

(Continued)

*Primary Examiner*—Fernando L Toledo
(74) *Attorney, Agent, or Firm*—Dickstein Shapiro LLP

(57) ABSTRACT

A MEMS device comprising a flexible membrane that is free to move in response to pressure differences generated by sound waves. A first electrode mechanically coupled to the flexible membrane, and together form a first capacitive plate. A second electrode mechanically coupled to a generally rigid structural layer or back-plate, which together form a second capacitive plate. A back-volume is provided below the membrane. A first cavity located directly below the membrane. Interposed between the first and second electrodes is a second cavity. A plurality of bleed holes connected the first cavity and the second cavity. Acoustic holes are arranged in the back-plate so as to allow free movement of air molecules, such that the sound waves can enter the second cavity. The first and second cavities in association with the back-volume allow the membrane to move in response to the sound waves entering via the acoustic holes in the back-plate.

40 Claims, 21 Drawing Sheets

U.S. PATENT DOCUMENTS

| | | |
|---|---|---|
| 6,243,474 B1 | 6/2001 | Tai et al. |
| 6,667,189 B1 | 12/2003 | Wang et al. |
| 7,089,798 B2 | 8/2006 | Silverbrook et al. |
| 7,395,698 B2 | 7/2008 | Degertekin |
| 2002/0135708 A1 | 9/2002 | Murden et al. |
| 2003/0079548 A1 | 5/2003 | Potter et al. |
| 2003/0087468 A1 | 5/2003 | Gulvin et al. |
| 2005/0249041 A1 | 11/2005 | Pedersen |
| 2005/0262947 A1 | 12/2005 | Dehe |
| 2006/0219020 A1 | 10/2006 | Silverbrook et al. |
| 2007/0165896 A1 | 7/2007 | Miles et al. |
| 2007/0189555 A1 | 8/2007 | Yamaoka et al. |
| 2007/0295064 A1 | 12/2007 | Degertekin et al. |
| 2008/0083957 A1 | 4/2008 | Wei et al. |
| 2008/0212409 A1 | 9/2008 | Lutz |
| 2008/0315333 A1 | 12/2008 | Combi et al. |
| 2009/0108382 A1 | 4/2009 | Eriksen et al. |
| 2009/0169035 A1 | 7/2009 | Rombach et al. |
| 2009/0200620 A1 | 8/2009 | Omura et al. |
| 2009/0232336 A1 | 9/2009 | Pahl |

FOREIGN PATENT DOCUMENTS

| | | |
|---|---|---|
| EP | 1 215 476 A2 | 6/2002 |
| EP | 1 443 017 A2 | 8/2004 |
| EP | 1 469 701 A2 | 10/2004 |
| EP | 1 722 595 A1 | 11/2006 |
| GB | 2 435 544 A | 8/2007 |
| WO | WO 99/47902 | 9/1999 |
| WO | WO 03/054938 | 7/2003 |
| WO | WO 2005/086533 A1 | 9/2005 |

OTHER PUBLICATIONS

Y. Ning et al., "Fabrication of a Silicon Micromachined Capacitive Microphone Using a Dry-Etch Process", Sensors and Actuators A, Elsevier Sequoia, vol. 53, No. 1, May 1996, pp. 237-242.

MEMS PROCESS AND DEVICE

This is a divisional of application Ser. No. 11/723,514, filed Mar. 20, 2007 now U.S. Pat. No. 7,781,249, which is hereby incorporated by reference in its entirety.

FIELD OF THE INVENTION

This invention relates to a MEMS process and device, and in particular to a MEMS process and device relating to a transducer, and in particular a capacitive microphone.

BACKGROUND OF THE INVENTION

Consumer electronics devices are continually getting smaller and, with advances in technology, are gaining ever increasing performance and functionality. This is clearly evident in the technology used in consumer electronic products such as mobile phones, laptop computers, MP3 players and personal digital assistants (PDAs). Requirements of the mobile phone industry for example, are driving the components to become smaller with higher functionality and reduced cost. It is therefore desirable to integrate functions of electronic circuits together and combine them with transducer devices such as microphones and speakers.

The result of this is the emergence of micro-electrical-mechanical-systems (MEMS) based transducer devices. These may be for example, capacitive transducers for detecting and/or generating pressure/sound waves or transducers for detecting acceleration. There is a continual drive to reduce the size and cost of these devices through integration with the electronic circuitry necessary to operate and process the information from the MEMS through the removal of the transducer-electronic interfaces. One of the challenges in reaching these goals is the difficulty of achieving compatibility with standard processes used to fabricate complementary-metal-oxide-semiconductor (CMOS) electronic devices during manufacture of MEMS devices. This is required to allow integration of MEMS devices directly with conventional electronics using the same materials and processing machinery. This invention seeks to address this area.

Microphone devices formed using MEMS fabrication processes typically comprise one or more membranes with electrodes for read-out/drive deposited on the membranes and/or a substrate. In the case of MEMS pressure sensors and microphones, the read out is usually accomplished by measuring the capacitance between the electrodes. In the case of transducers, the device is driven by a potential difference provided across the electrodes.

FIG. 1 shows a capacitive microphone formed on a substrate 2. A first electrode 4 is mechanically connected to a membrane 6. A second electrode 8 is mechanically connected to a structurally rigid back-plate 14. During the manufacture of the MEMS device described above, the membrane 6 is formed using a sacrificial layer located between the membrane 6 and the second electrode 8. A back-volume 12 is formed using an etching process from below the substrate, known as a "back-etch". The sacrificial layer between the membrane 6 and second electrode 8 is removed later in the process to leave the membrane 6 suspended and free to move.

A disadvantage of the process described above is that the back-etch is difficult to perform in an accurate manner when using a wet-etch or a dry-etch. In other words, it is difficult to obtain a consistent back-volume, particularly when performing a wet back-etch, since the sides of the back-volume tend to converge inwards as they approach the first electrode 4 and membrane 6, rather than being parallel as shown in the ideal scenario of FIG. 1. This tapering of the back-etch can alter the dimensions of the electrode 4 and membrane 6, and thereby change the operating characteristics of the microphone such as its frequency response and sensitivity.

It will also be appreciated that, in order to incorporate the transducers into useful devices, it is necessary to interface or couple them to electronic circuitry, which may either be located on the same substrate or a separate integrated circuit. However, this can lead to problems with interference, noise and parasitic capacitance and inductance.

Typically the membranes are thin, of the order of tenths of a micron, and can range in size from tens to thousands of microns. As a result, the devices can be fragile and may be damaged during singulation. Singulation is a process in which a substrate wafer on which the MEMS devices are fabricated is diced up so that only one device (or a group of devices) is found on each diced piece. This process is typically achieved by dicing the wafer with a high-speed rotating diamond blade. Alternatively the wafer may be cut up using a laser, or scribed and cleaved along a crystallographic axis. All of these dicing methods have associated problems when applied to MEMS structures.

During blade singulation the surface of the wafer is typically flooded with a lubricating coolant, usually water, that is meant to prevent the temperature of the wafer from becoming too high and to ensure the diamond blade stays in a safe operating range. This produces a slurry from the water and abraded pieces of wafer that may penetrate any open part of the MEMS structure and render it useless, as it is difficult to clean the slurry out at a later stage due to the small size of the singulated devices. Additionally, the lubricating coolant may be sprayed onto the wafer at high speed thus placing any delicate sensor structure under high mechanical stress and potentially damaging it.

Laser singulation is slightly cleaner than blade dicing but is more expensive. However, the heating produced by the cutting process may set up thermal gradients leading to areas of different thermal expansion in the sensor structures that may distort them and render them useless. Also the laser singulation process produces some residue that may clog any open structure and prevent the device from operating properly.

Finally, singulating the wafer by scribing and cleaving places extremely high mechanical stress on the wafer during the cleaving process and produces a large amount of debris that may damage the device as above.

SUMMARY OF THE INVENTION

According to a first aspect of the invention, there is provided a method of fabricating a micro-electrical-mechanical system (MEMS) transducer on a substrate. The method comprises the steps of depositing a first sacrificial layer with respect to a first side of a membrane; depositing a second sacrificial layer with respect to a second side of the membrane; and removing the first and second sacrificial layers so as to form a MEMS transducer in which the membrane is moveable.

The provision of first and second sacrificial layers has a number of advantages. First, the sacrificial layers help protect the membrane during other fabrication steps. Secondly, the first and second sacrificial layers enable the size of the membrane to be formed independent of a subsequent back etch process.

According to another aspect of the invention, there is provided a method of fabricating a micro-electrical-mechanical system (MEMS) microphone on a substrate. The method comprises the steps of: depositing first and second electrodes;

depositing a membrane, the membrane being mechanically coupled to the first electrode; and depositing a back plate, the back plate being mechanically coupled to the second electrode. The step of depositing the membrane further comprises the step of depositing the membrane on a first sacrificial layer. The method further comprises the steps of: depositing a second sacrificial layer in an area between the first and second electrodes; and removing the first and second sacrificial layers so as to form a MEMS microphone having a first cavity beneath the membrane, and a second cavity between the first and second electrodes; such that the membrane and the first electrode are able to move relative to the second electrode.

According to a further aspect of the invention, there is provided a micro-electrical-mechanical system (MEMS) capacitive microphone comprising: first and second electrodes; a membrane that it is mechanically coupled to the first electrode; and a back plate that it is mechanically coupled to the second electrode; wherein the first and second electrodes each have a diameter that is different to the diameter of the membrane.

According to a further aspect of the invention, there is provided a micro-electrical-mechanical system (MEMS) capacitive microphone comprising: first and second electrodes; a membrane that it is mechanically coupled to the first electrode; and a back plate that it is mechanically coupled to the second electrode; wherein the second electrode comprises one or more openings.

According to a further aspect of the invention, there is provided a method of fabricating a micro-electrical-mechanical system (MEMS) microphone. The method comprises the steps of: depositing first and second electrodes; depositing a membrane that it is mechanically coupled to the first electrode; and depositing a back plate that it is mechanically coupled to the second electrode; wherein the step of depositing the second electrode comprises the step of forming a predetermined pattern in the second electrode, and wherein the predetermined pattern comprises one or more openings.

According to a further aspect of the invention, there is provided a method of testing a plurality of micro-electrical-mechanical system (MEMS) microphones formed on a wafer, each MEMS microphone comprising a membrane and at least one sacrificial layer. The method comprises the steps of: attaching the wafer to a carrier: singulating the wafer to form two or more MEMS microphones; removing the at least one sacrificial layer; and testing the MEMS microphones while attached to the carrier.

According to a further aspect of the invention, there is provided a micro-electrical-mechanical system (MEMS) microphone comprising: a substrate; first and second electrodes; a membrane that it is mechanically coupled to the first electrode; and a back plate that it is mechanically coupled to the second electrode; and further comprising: a first cavity beneath the membrane, the first cavity formed using a first sacrificial layer; and a second cavity between the first and second electrodes, the second cavity formed using a second sacrificial layer.

BRIEF DESCRIPTION OF THE DRAWINGS

For a better understanding of the invention, and to show more clearly how it may be carried into effect, reference will now be made, by way of example only, to the accompanying drawings in which.

DETAILED DESCRIPTION OF THE PREFERRED EMBODIMENT

Figure 1:
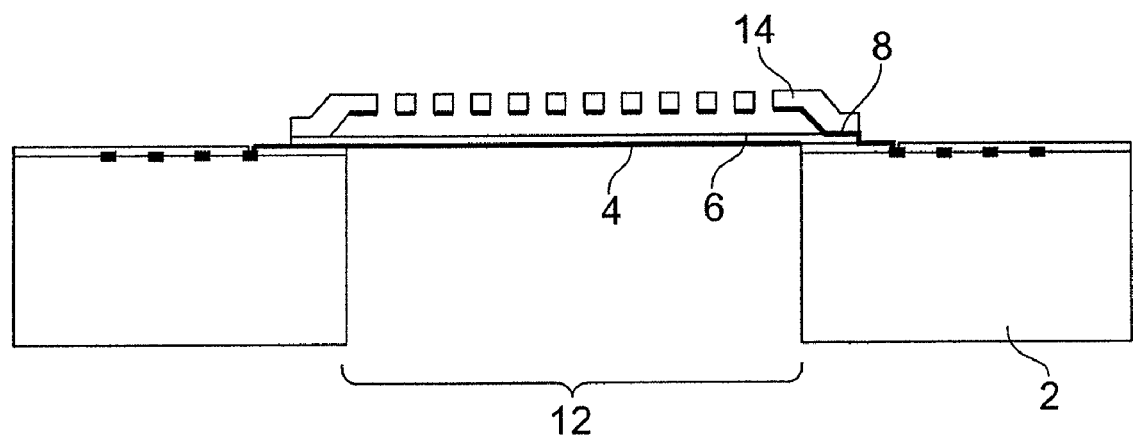
FIG. 1 is a schematic cross-sectional view of a MEMS microphone.
Figure 2:
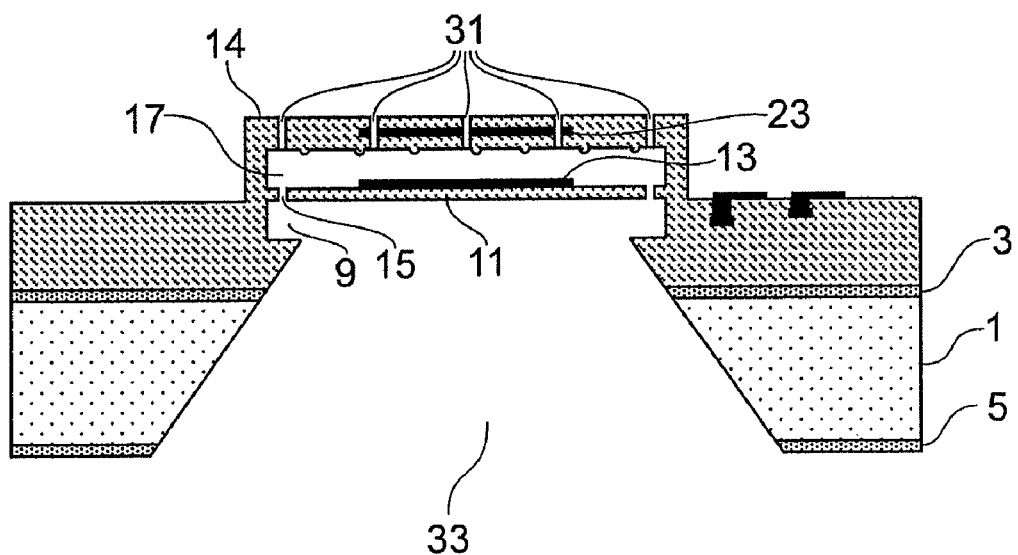
FIG. 2 is schematic cross-sectional view of a MEMS microphone according to the present invention.
Figure 3:
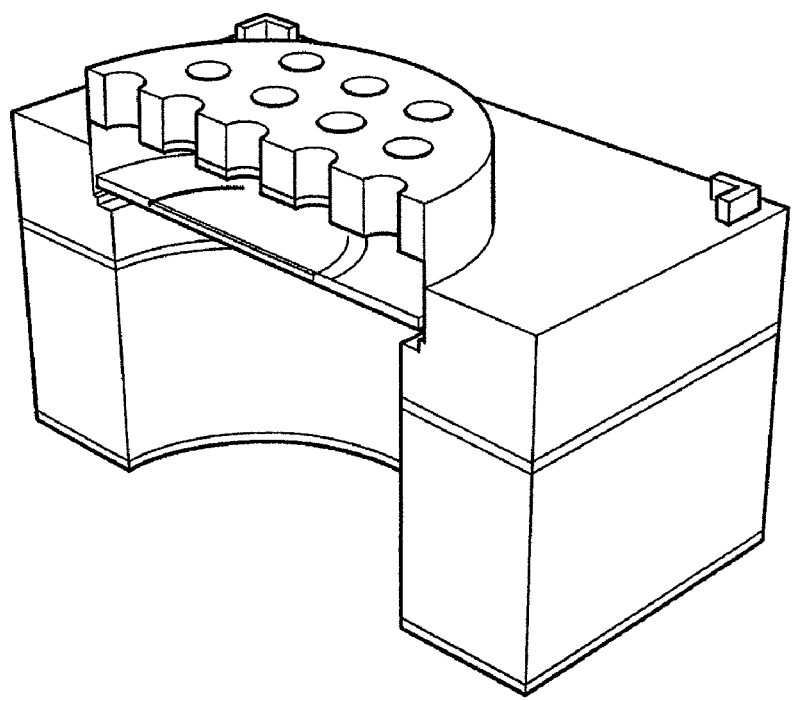
FIG. 3 is a perspective view of the MEMS microphone shown in FIG. 2.

FIGS. 2 and 3 show a schematic diagram and a perspective view, respectively, of a capacitive microphone device according to the present invention. The capacitive microphone device comprises a flexible membrane 11 that is free to move in response to pressure differences generated by sound waves. A first electrode 13 is mechanically coupled to the flexible membrane 11, and together they form a first capacitive plate of the capacitive microphone device. A second electrode 23 is mechanically coupled to a generally rigid structural layer or back-plate 14, which together form a second capacitive plate of the capacitive microphone device.

The capacitive microphone is formed on a substrate 1, for example a silicon wafer. A back-volume 33 is provided below the membrane 11, and is formed using a "back-etch" through the substrate 1, as will be described in greater detail later in the application. A first cavity 9 is located directly below the membrane 11. The first cavity 9 is formed using a first sacrificial layer during the fabrication process. Interposed between the first and second electrodes 13 and 23 is a second cavity 17. The second cavity 17 is formed using a second sacrificial layer during the fabrication process. A plurality of openings, hereinafter referred to as bleed holes 15, connect the first cavity 9 and the second cavity 17. A further plurality of openings, hereinafter referred to as acoustic holes 31, are arranged in the back-plate 14 so as to allow free movement of air molecules, such that the sound waves can enter the second cavity 17.

The first and second cavities 9 and 17 in association with the back-volume 33 allow the membrane 11 to move in response to the sound waves entering via the acoustic holes 31 in the back-plate 14.

As will be appreciated more fully from the detailed description of the fabrication process in FIGS. 4 to 19 below, the provision of first and second sacrificial layers has the advantage of disassociating the etching of the back-volume from the formation of the membrane 11. In particular, the formation of the first cavity 9 using the first sacrificial layer means that the etching of the back-volume does not play any part in defining the diameter of the membrane. Instead, the diameter of the membrane 11 is defined by the diameter of the first cavity 9 (which in turn is defined by the diameter of the first sacrificial layer) in combination with the diameter of the second cavity 17 (which in turn is defined by the diameter of the second sacrificial layer). As will be explained in more detail below, the diameter of the first cavity 9 formed using the first sacrificial layer can be controlled more accurately than the diameter of a back-etch process performed using a wet-etch or a dry-etch.

The bleed holes 15 connecting the first cavity 9 with the second cavity 17 have numerous advantages. For example, during the fabrication process the bleed holes 15 assist with the removal of the first and second sacrificial layers. In particular, when etching from above the membrane 11 using a dry etch process, for example, the bleed holes 15 allow portions of the first sacrificial layer that have not been previously etched during a back-etch process to be etched via the bleed holes 15, i.e. from above the device. In other words, once the etching process from above the membrane has removed the second sacrificial layer in the second cavity 17, the bleed holes 15 enable the etching process to remove the first sacrificial layer in the areas under the bleed holes 15, in the outer area of the first cavity 9.

In addition, once the sacrificial layers have been removed, the bleed holes 15 allow a limited or restricted flow of air to pass from the second cavity 17 to the first cavity 9 and back-volume 33. The tortuous path of this air flow helps improve the operating characteristics of the capacitive microphone at certain frequencies. For example, the bleed holes 15 may be configured such that they provide low resistance for pressure waves having a frequency of less than about 20 Hz (i.e. the bottom end of the human audible range), and providing greater resistance to higher frequency pressure waves. This ensures that the higher frequency pressure signals act on the membrane, rather than bypassing the membrane via the bleed holes 15. This characteristic of the capacitive microphone has the advantage of damping or eliminating undesired low frequency signals, for example wind noise, by allowing such undesired signals to bypass the membrane. It is noted that the frequency response of the device follows the classic 1/-RC relationship, where in this case R relates to the restricted flow of air through the bleed holes 15, and C relates to the volume of the back-volume 33. It will therefore be appreciated that the operating characteristics of the device can be altered by tuning the position and size of the bleed holes 15 and/or back-volume 33 during the manufacturing process. It is also noted that the frequency response of the device can be tuned according to the characteristics of the electronic circuitry with which the microphone is intended to interface.

Further details of the aspects described above will be provided later in the application with reference to FIGS. 4 to 19.

In order to process an electrical output signal from the microphone, the device may have circuit regions (not shown) that are integrally fabricated using standard CMOS processes on the substrate 1. The circuit regions may comprise conducting (for example aluminium or copper) circuit interconnects that are used to electrically connect to the microphone via interconnect points to the circuit region.

The circuit regions may be fabricated in the CMOS silicon substrate using standard processing techniques such as ion implantation, photomasking, metal deposition and etching. The circuit regions may comprise any circuit operable to interface with a MEMS microphone and process associated signals. For example, one circuit region may be a pre-amplifier connected so as to amplify an output signal from the microphone. In addition another circuit region may be a charge-pump that is used to generate a bias, for example 10 volts, across the two electrodes. This has the effect that changes in the electrode separation (i.e. the capacitive plates of the microphone) change the MEMS microphone capacitance; assuming constant charge, the voltage across the electrodes is correspondingly changed. A pre-amplifier, preferably having high impedance, is used to detect such a change in voltage.

The circuit regions may optionally comprise an analogue-to-digital converter (ADC) to convert the output signal of the microphone or an output signal of the pre-amplifier into a corresponding digital signal, and optionally a digital signal processor to process or part-process such a digital signal. Furthermore, the circuit regions may also comprise a digital-to-analogue converter (DAC) and/or a transmitter/receiver suitable for wireless communication. However, it will be appreciated by one skilled in the art that many other circuit arrangements operable to interface with a MEMS transducer signal and/or associated signals, may be envisaged.

It will also be appreciated that, alternatively, the microphone device may be a hybrid device (for example whereby the electronic circuitry is totally located on a separate integrated circuit, or whereby the electronic circuitry is partly located on the same device as the microphone and partly located on a separate integrated circuit) or a monolithic device (for example whereby the electronic circuitry is fully integrated within the same integrated circuit as the microphone).

The microphone has a diameter of typically 1 mm. Other dimensions are provided below as examples in relation to the fabrication process.

The operation of the microphone will now be briefly described. In response to a sound wave corresponding to a pressure wave incident on the microphone, the membrane 11 is deformed slightly from its equilibrium position. The distance between the lower electrode 13 and the upper electrode 23 is correspondingly altered, giving rise to a change in capacitance between the two electrodes that is subsequently detected by electronic circuitry (not shown).

The process by which the above embodiment may be fabricated will now be described with reference to FIGS. 4-19 and with reference to the elements described above in FIG. 2.

FIGS. 4 to 19 are schematic cross-sectional and/or perspective views illustrating the fabrication process for the MEMS microphone shown in FIGS. 2 and 3.

In the description of FIGS. 4 to 19 it is noted that various dimensions (both written and illustrated) are provided as examples only. Furthermore, references to stress values and targets are intended to refer to the resultant layer/feature stresses for the fully processed MEMS device, and not the stresses of the individual layer/feature as deposited.

Figure 4:
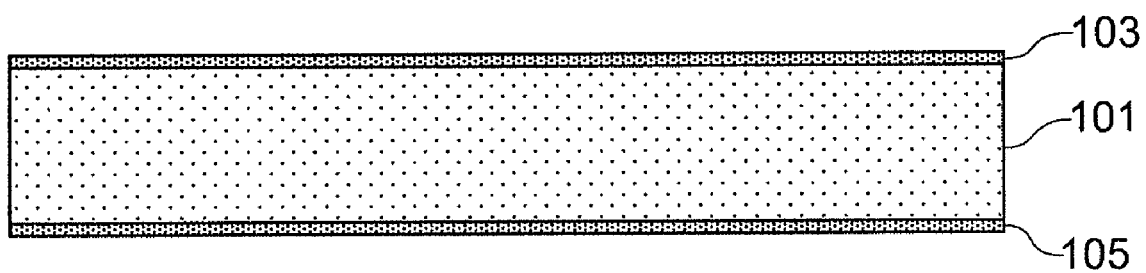
FIGS. 4 to 19 are schematic cross sectional views and perspective views illustrating the fabrication process for the MEMS microphone detailed in FIGS. 2 and 3.

Referring to FIG. 4, the fabrication process of the MEMS device is based on a substrate 101. In this example, for integration with CMOS electronics and CMOS processing techniques the substrate 101 is a silicon wafer, but it will be appreciated that other substrate materials and electronic fabrication techniques could be used instead. The silicon substrate 101 is subjected to thermal oxidation to form thermal oxidation wafer layers 103 and 105. The silicon substrate 101 has a thickness, for example, in the range 300 um to 1000 um, for example 625 um. Each thermal oxidation layer 103, 105 has a thickness of up to 15 um, for example 0.6 um. It is noted that the thermal oxidation layers 103, 105 are compressive. As an alternative to using thermal oxidation, the oxide layers may be deposited using a plasma enhanced chemical vapour deposition (PECVD).

Figure 5A:
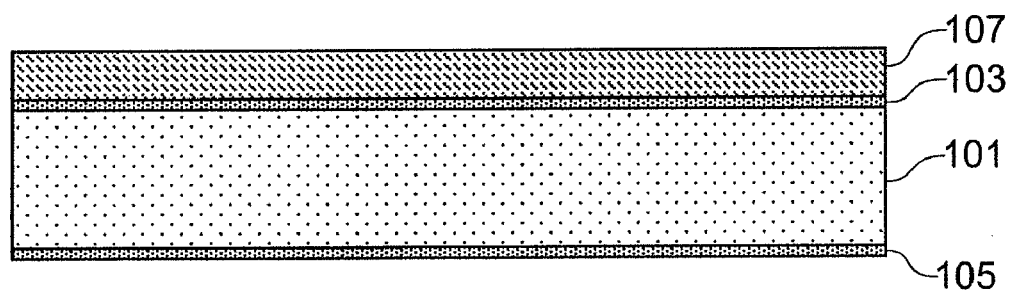
Figure 5B:
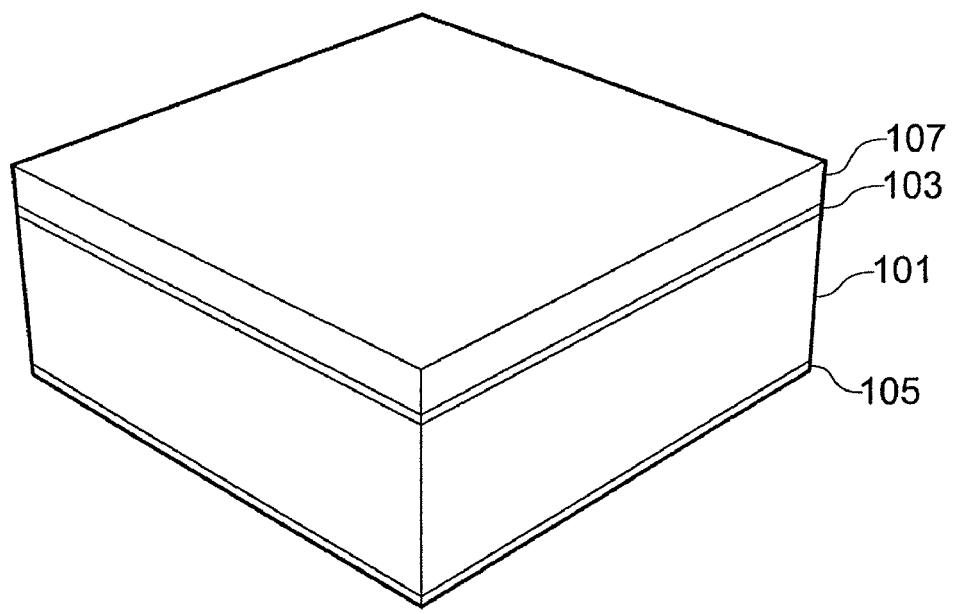

In FIG. 5 a dielectric layer, for example a silicon nitride dielectric layer 107, is deposited on the thermal oxidation layer 103. The silicon nitride dielectric layer 107 can be deposited using a process such as plasma enhanced chemical vapour deposition (PECVD) at a temperature of 300° C. The silicon nitride dielectric layer 107 acts as an etch stop layer during subsequent processing of the MEMS device (and in particular in relation to the etching of the back-volume described below in FIG. 18). Preferably the silicon nitride dielectric layer 107 has a thickness in the range 2.3 um to 2.7 um, for example 2.5 um, and a tensile stress of between 25 to 75 MPa, for example 50 MPa. It will be appreciated that other dielectric layers and/or processes may be used. For example the layer might not be pure silica—BoroPhosphoSilicate Glass or BPSG may also be used as it can be deposited at lower temperatures. It will be appreciated by a person skilled in the art that the stress of a layer will not only relate to the thickness of the layer, but also the deposition conditions.

Figure 6A:
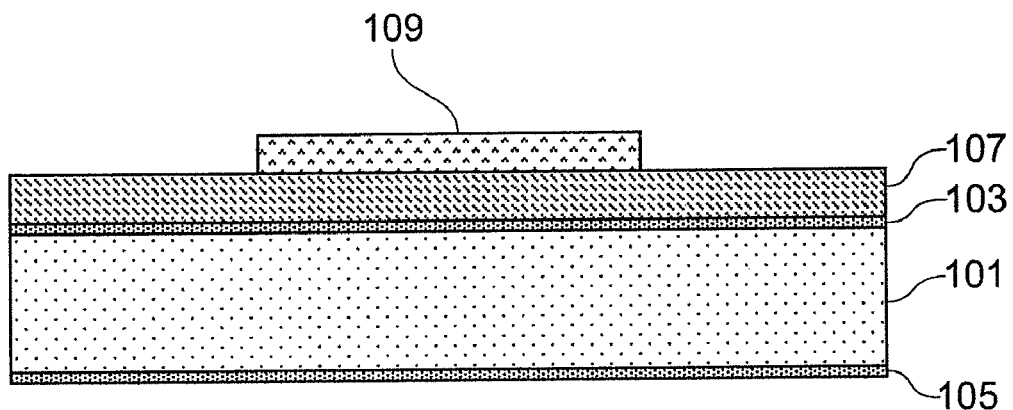
Figure 6B:
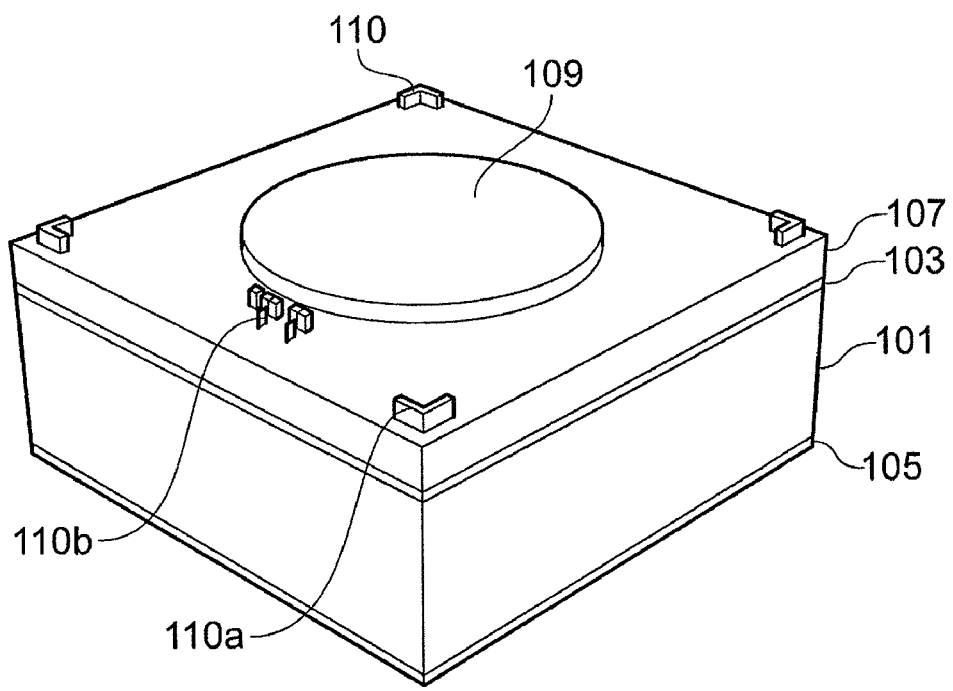

Next, referring to FIG. 6a, a first sacrificial layer 109 is formed on the silicon nitride dielectric layer 107 by depositing and etching a coating. To ensure compatibility with CMOS fabrication techniques, the first sacrificial layer 109 can be made of a number of materials which can be removed using a dry release process. Using a dry release process is advantageous in that no additional process steps or drying are required after the sacrificial layer is released. Polyimide is preferable as the sacrificial layer (for example Hitachi Dupont polyimide PI2610 or PI2545), as it can be spun onto the substrate easily and removed with an oxygen plasma clean. The polyimide coating is spun on the wafer to form a conformal coating, and subsequently cured at a temperature of 200° C. for 30 minutes in air at atmospheric pressure, and then at 375° C. for 30 minutes in a flowing nitrogen environment at atmospheric pressure. It will be appreciated by a person skilled in the art that the values of these parameters are provided as examples only and that any conditions suitable to deposit a polyimide sacrificial layer may be envisaged. A primer may be used for the polyimide layer, such as HD VM651 for example. The polyimide layer is then patterned with photoresist and etched in an anisotropic oxygen plasma, thus leaving the first sacrificial layer 109 as shown in FIG. 6a. The first sacrificial layer 109 has a thickness, for example, of between 0.9 um to 1.1 um, for example 1 um. It will appreciated by a person skilled in the art that alternative methods of depositing the first sacrificial layer 109 may be used, for example applying and etching a photosensitive polyimide.

The first sacrificial layer 109 defines the dimensions and shape of the cavity underneath the membrane (i.e. the first cavity 9 in FIG. 2) that will be left when the first sacrificial layer 109 is removed as discussed below. In addition to creating the first sacrificial layer 109, the etching of the polyimide coating may also involve the formation of identification and/or alignment features (for example 110, 110a, 110b shown in FIG. 6b in perspective view). The identification and alignment features assist with the subsequent processing of the MEMS device.

The first sacrificial layer 109 is provided for a number of reasons. These include supporting and protecting the membrane of the MEMS device during the manufacturing process. The first sacrificial layer 109 is also provided for defining the diameter of the membrane, such that the size of the membrane can be determined in advance based on the size of the first sacrificial layer, rather than being based on an etching process that is carried out when forming the back-volume from underneath the wafer.

Figure 7A:
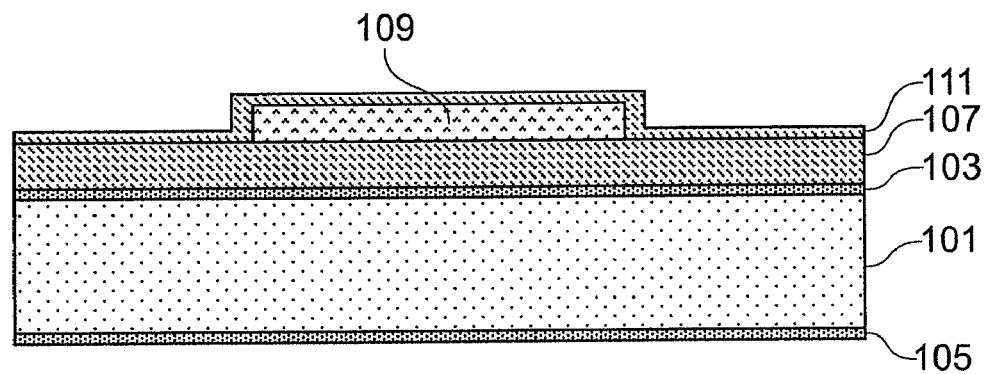
Figure 7B:
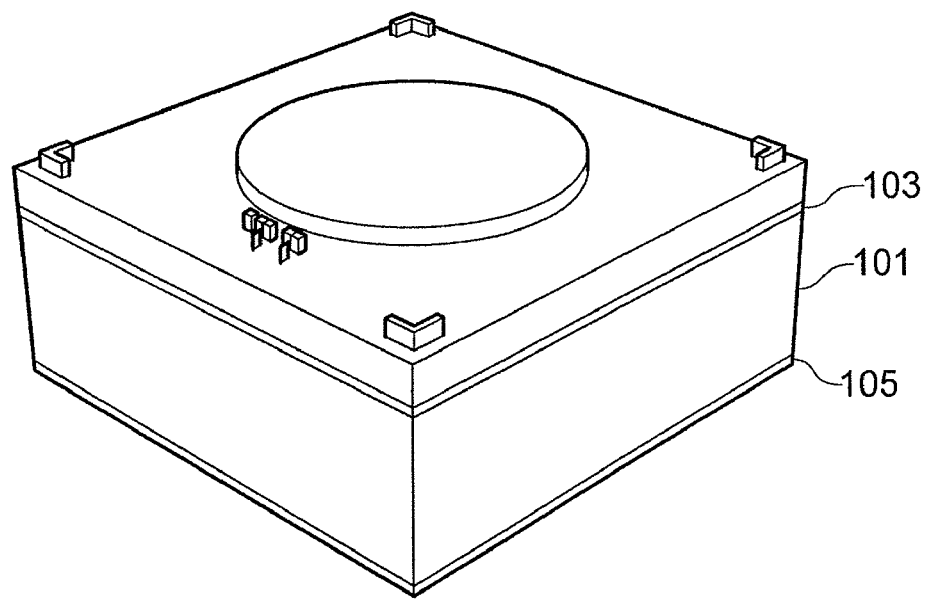

In FIG. 7 a diaphragm layer, for example a silicon nitride diaphragm layer 111, is deposited over the silicon nitride dielectric layer 107 and the first sacrificial layer 109. Part of the silicon nitride diaphragm layer 111 is used in the formation of the membrane of the microphone (i.e. the membrane 11 in FIG. 2). The silicon nitride diaphragm layer 111 can be deposited using a PECVD process at 300° C., with Silane ($SiH_4$), Ammonia ($NH_3$) and nitrogen ($N_2$) having respective flow rates of 40, 40 and 1400 sccm (standard cubic centimeters/minute). The RF power can be 20 W and can be alternated every 6 seconds between a high frequency (13.56 MHz) and a low frequency (400 kHz). The silicon nitride diaphragm layer 111 has a thickness, for example of between 0.38 um to 0.42 um, for example 0.4 um, and a tensile stress of between 40 to 50 MPa, for example 45 MPa.

Although not shown in FIGS. 6a and 7a, the upper surface of the first sacrificial layer 109 may be formed with one or more dimples (in the form of small cavities) in its outer area (i.e. near the periphery of the first sacrificial layer 109). As a result, the depositing of the silicon nitride diaphragm layer 111 causes one or more dimples (in the form of protrusions) to be formed in the outer area or periphery of the membrane. These dimples in the outer area of the membrane 11 reduce the contact area of the membrane with the underlying substrate. This prevents the membrane from sticking to the area shown in the "dog-leg" formed by the first cavity 9 in FIG. 2, i.e. in the area away from the opening formed by the back-volume. The dimples reduce the stiction forces such that they are below the restoring forces (i.e. the membrane tension), thereby allowing the membrane to release itself.

It is noted that the membrane 11 may be formed from materials other than silicon nitride. For example, the membrane may also be polysilicon. Alternatively, the membrane may be part of a sandwich structure comprising metal/nitride/metal or nitride/metal/nitride. For example, a composite stack could be formed from aluminium/silicon nitride/aluminium (having thicknesses, for example, of 50 nm/400 nm/50 nm). Alternatively, the metal layer may be buried in a composite stack formed from silicon nitride/aluminium/silicon nitride (having thicknesses, for example, of 200 nm/50 nm/200 nm). In addition, titanium adhesive layers may be used between the aluminium and the silicon nitride. The formation of a sandwich structure has the advantage of reducing unwanted deformation in the membrane. In other words, if the electrode is placed between two layers of nitride, or vice versa, then the stress is more equalised, and results in the membrane moving with less unwanted deformation.

Figure 8A:
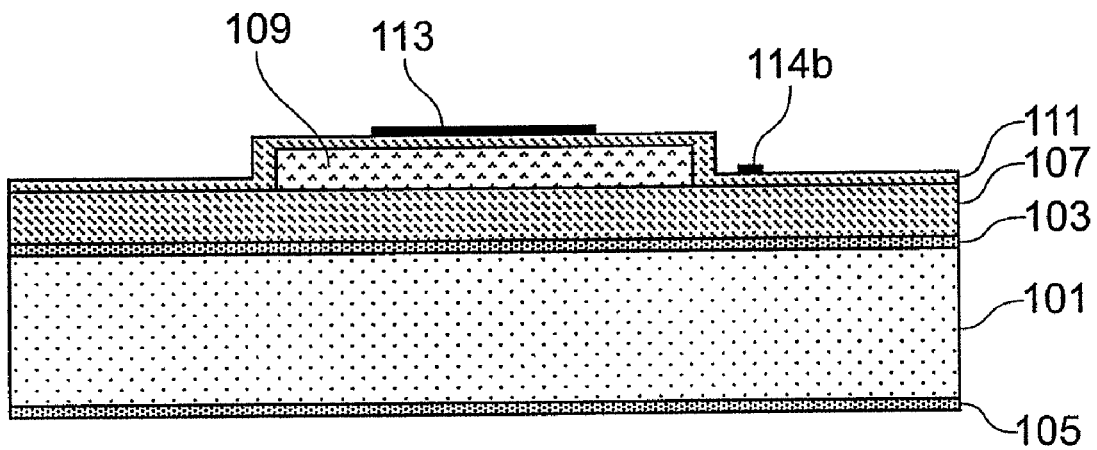

Next, referring to FIG. 8a, a first electrode 113 is formed by depositing or sputtering a conducting material, for example aluminium, on the silicon nitride diaphragm layer 111. Preferably the first electrode 113 has a thickness in the range 0.04 um to 0.06 um, for example 0.05 um, and a tensile stress of between 175 to 225 MPa, for example 200 MPa. It is noted that these thicknesses and stress values are based on the first electrode being made from aluminium, and that other thicknesses and stress values may apply from electrodes made from other materials. Depositing the first electrode 113 by sputtering is preferable to other methods such as thermal evaporation due to the low substrate temperatures used. This ensures compatibility with CMOS fabrication processes. In addition, where materials other than aluminium are deposited, this method benefits from the ability to accurately control the composition of the thin film that is deposited. Sputtering deposits material equally over all surfaces so the deposited thin film has to be patterned by resist application and dry etching with a $Cl_2/BCl_3$ gas mix to define the shape of the lower electrode 15 as well as to define the interconnect points 114b that allow interconnection to the circuit regions (i.e. either the underlying CMOS circuit or the off-chip circuits).

As can be seen from FIG. 8a, the first electrode 113 does not cover the whole diameter of the membrane 111 as the outer areas of the membrane 111 suffer less movement and thus contribute to a relatively fixed capacitance. Thus, according to this aspect of the invention the diameter of the first electrode 113 is different to the diameter of the membrane 111. For example, the diameter of the first electrode 113 may be between 50% to 70% of the diameter of the membrane 111. However, a person skilled in the art will realise that other values may be used. For example, the first electrode may be less than 90% of the diameter of the membrane; less than 80% of the diameter of the membrane, or any other value.

Although the material for the first electrode 113 in the preferred embodiment is aluminium, a person skilled in the art will realise that the first electrode 113 may comprise any other conductive material e.g. AlSi, AlSiCu, Ti, TiW, Cu, Ni, NiCr, Cr, Pt, Ta or Pd suitable for use as the electrode material.

Figure 8B:
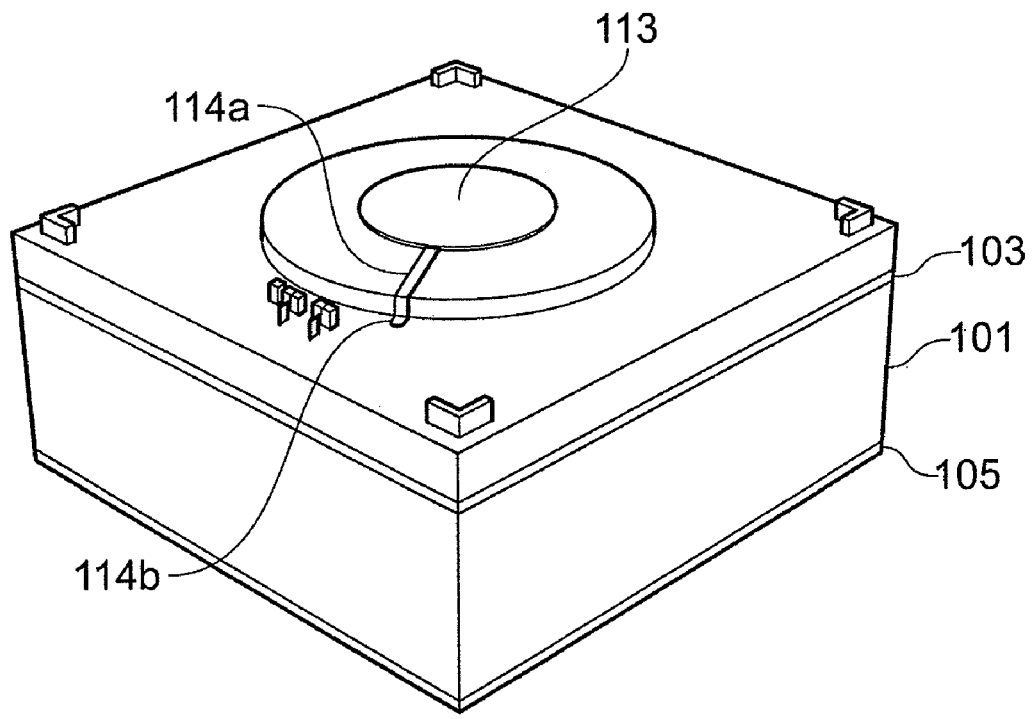

A perspective view of the first electrode 113 is shown in FIG. 8b, which shows how the first electrode 113 has an associated track 114a and pad 114b for interconnecting the first electrode 113 to other circuitry, either on the same substrate or a different integrated circuit. The track 114a is not shown in FIG. 8a due to the nature of the cross-section taken. It will be appreciated that other electrode materials or electrode stacks may be used to minimise stress. For example, an electrode stack may comprise a titanium adhesive layer and an aluminium conductor.

Figure 9:
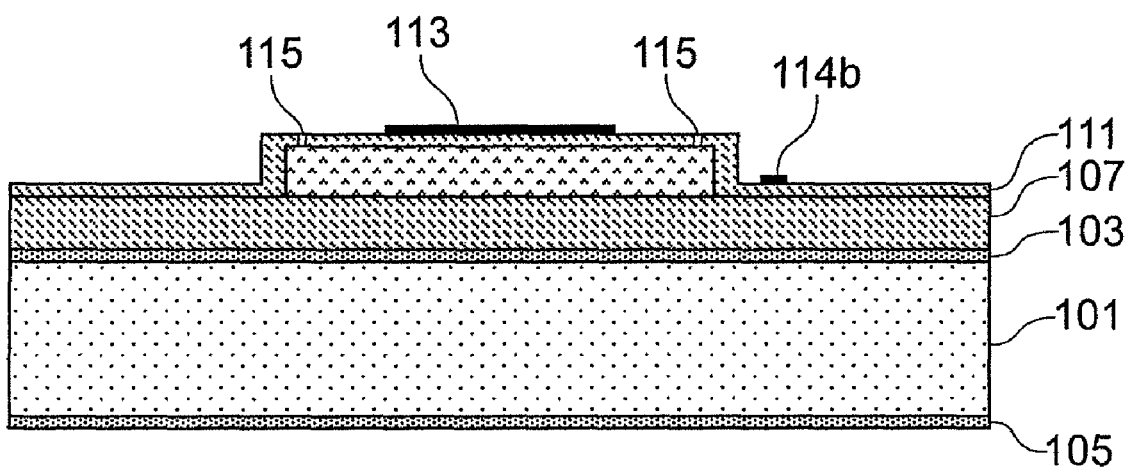

In FIG. 9 a plurality of openings or bleed holes 115 are formed in the diaphragm region of the silicon nitride diaphragm layer 111. The bleed holes 115 may be formed by etching the holes in the silicon nitride diaphragm layer 111. The bleed holes 115 may be about 2 um in diameter, for example. As an alternative to forming the bleed holes 115 after the formation of the first electrode 113, it is noted that the bleed holes 115 could also be formed immediately after the step of forming the silicon nitride diaphragm layer 111, and before forming the first electrode 113. The bleed holes 115 are arranged such that an area etched through a first bleed hole 115 substantially overlaps an area etched through an adjacent bleed hole. The bleed holes may have a spacing of less than 100 um. Further details regarding the positioning of the bleed holes will be discussed below in relation to FIGS. 21a, 21b and 22c.

Figure 10A:
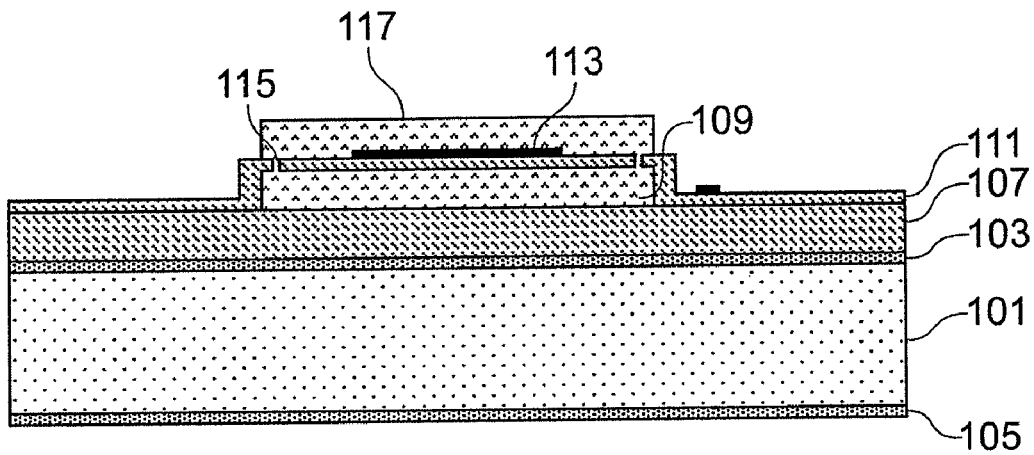
Figure 10B:
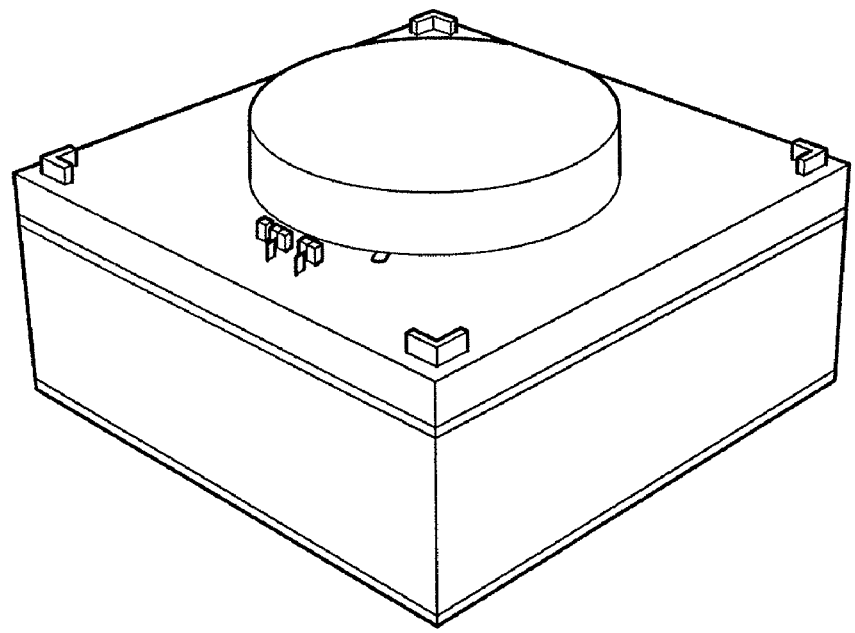

In FIG. 10a a second sacrificial layer 117, preferably a polyimide layer the same as or similar to the first sacrificial layer 109, is deposited over the silicon nitride diaphragm layer 111, such that the second sacrificial layer 117 covers the first electrode 113 and the bleed holes 115. The second sacrificial layer 117 defines the dimensions and shape of the cavity above the membrane (i.e. the second cavity 17 in FIG. 2) that will be left when the second sacrificial layer 117 is removed as discussed below. The second sacrificial layer 117 has a thickness, for example, of between 2.1 um to 2.3 um, for example 2.2 um. Although the second sacrificial layer 117 is shown as having approximately the same dimensions as the first sacrificial layer 109, it is noted that the first and second sacrificial layers 109, 117 may have different dimensions, for example different thicknesses and/or different diameters. FIG. 10b shows a perspective view of the device with the second sacrificial layer 117 added.

Figure 11:
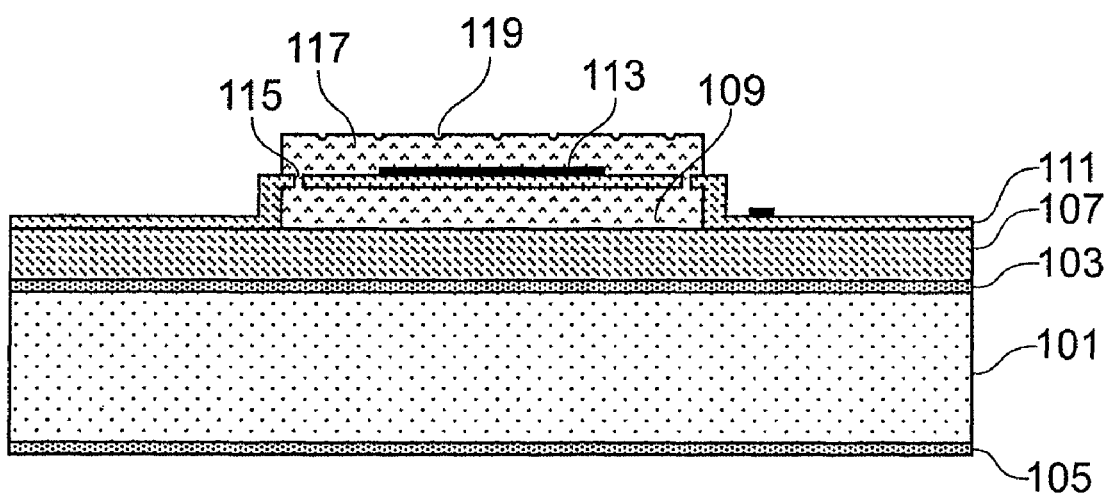

FIG. 11 shows how a plurality of dimples 119 (in the form of small cavities) may be formed in the surface of the second sacrificial layer 117. The dimples 119 may be 200 nm deep, for example. Although not essential, the dimples 119 reduce the contact area in the event of over-pressure or membrane pull-in, whereby the surface of the membrane comes in contact with another surface of the MEMS device. The dimples 119 reduce the stiction forces such that they are below the restoring forces (i.e. the membrane tension), thereby allowing the membrane to release itself.

Figure 12A:
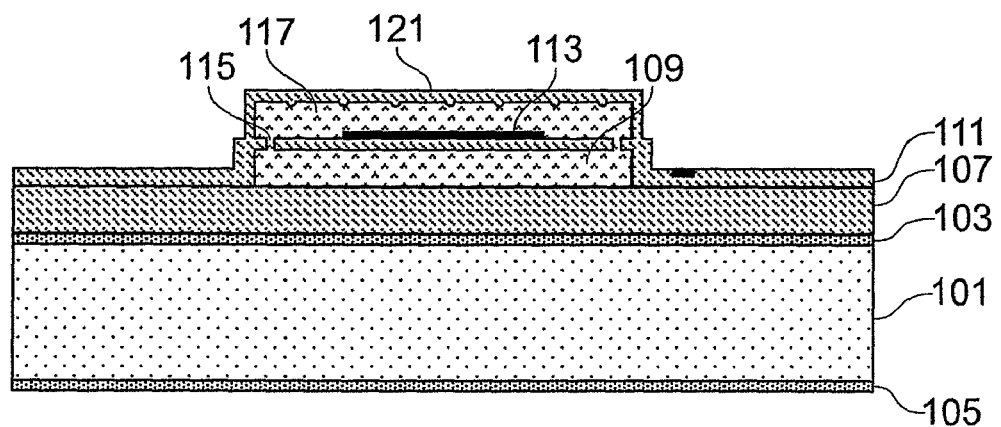
Figure 12B:
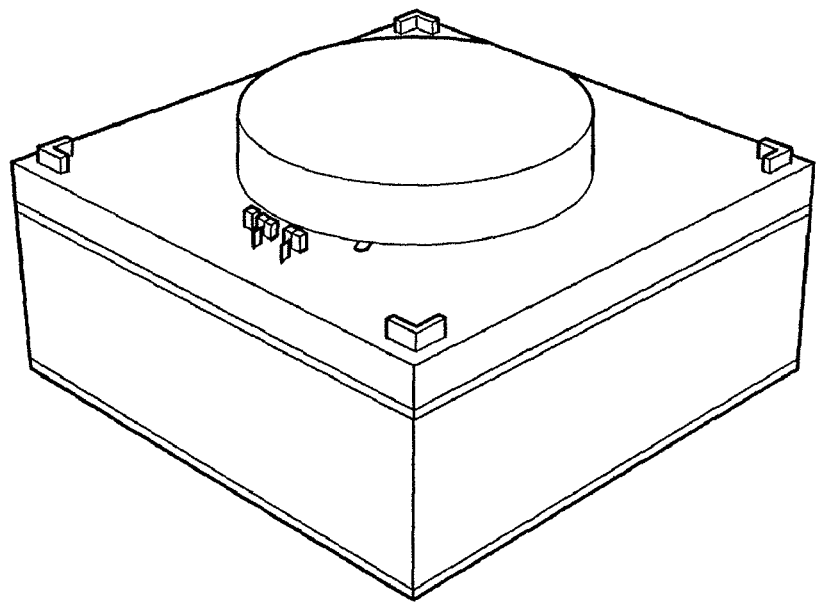

A back-plate for supporting a second electrode is then formed by first depositing a lower silicon nitride back-plate layer 121 as shown in FIG. 12a. The lower silicon nitride back-plate layer 121 can be deposited using the PECVD process at 300° C. as described above. The lower silicon nitride back-plate layer 121 has a thickness, for example, of between 0.28 um to 0.32 um, for example 0.3 um, and a tensile stress of between 50 to 200 MPa, for example 100 MPa. FIG. 12b shows a perspective view of the device with the silicon nitride back-plate layer 121 added.

Figure 13A:
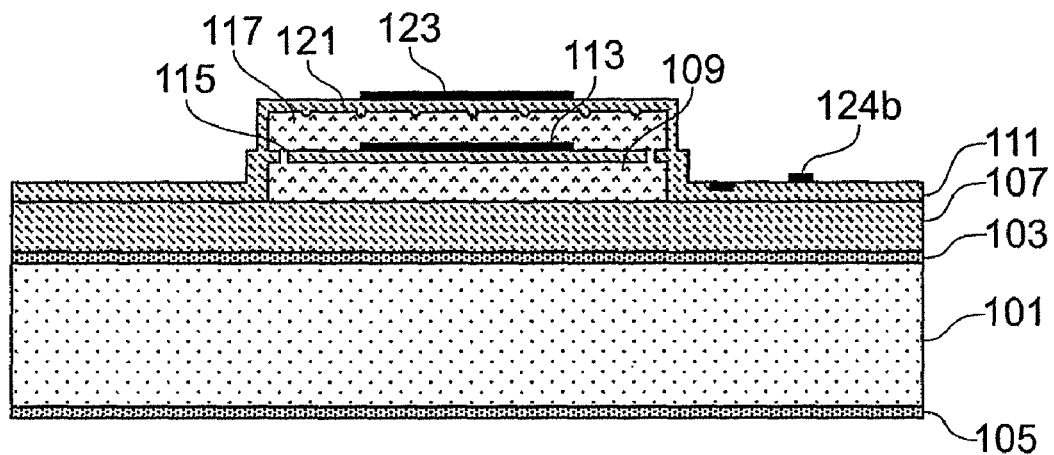
Figure 13B:
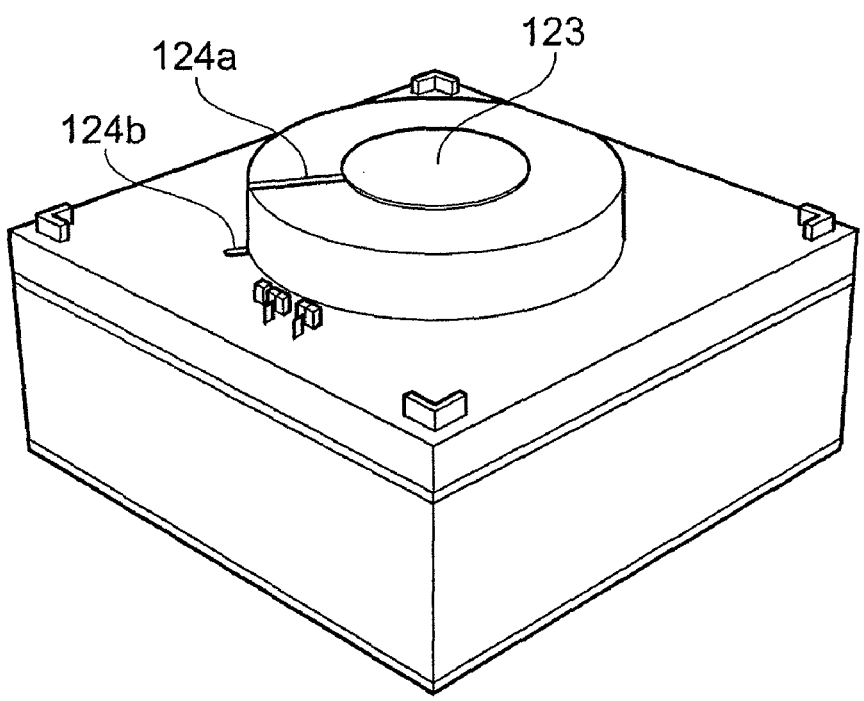

The second electrode 123 is then formed as shown in FIG. 13a, by depositing a conducting layer, for example aluminium, on the lower silicon nitride back-plate layer 121. The second electrode 123 has a thickness, for example, of between 0.09 um and 0.11 um, for example 0.1 um. FIG. 13b shows a perspective view of the second electrode 123 and its associate track 124a and pad 124b for connection to other circuit components. It will be appreciated that the track 124a is not shown in FIG. 13a due to the nature of the cross-section taken. As can be seen from FIG. 13a, the second electrode 123 is approximately the same diameter as the first electrode 113. As such, the diameter of the second electrode 123 is different to the diameter of the membrane 111. Further details about this aspect of the invention, including further aspects relating to the shape and size of the second electrode 123, will be described later in the application with reference to FIG. 20.

As with the first electrode 113, the material for the second electrode 123 may comprise any conductive material e.g. Al, AlSi, AlSiCu, Ti, TiW, Cu, Ni, NiCr, Cr, Pt, Ta or Pd suitable for use as the electrode material.

Figure 14A:
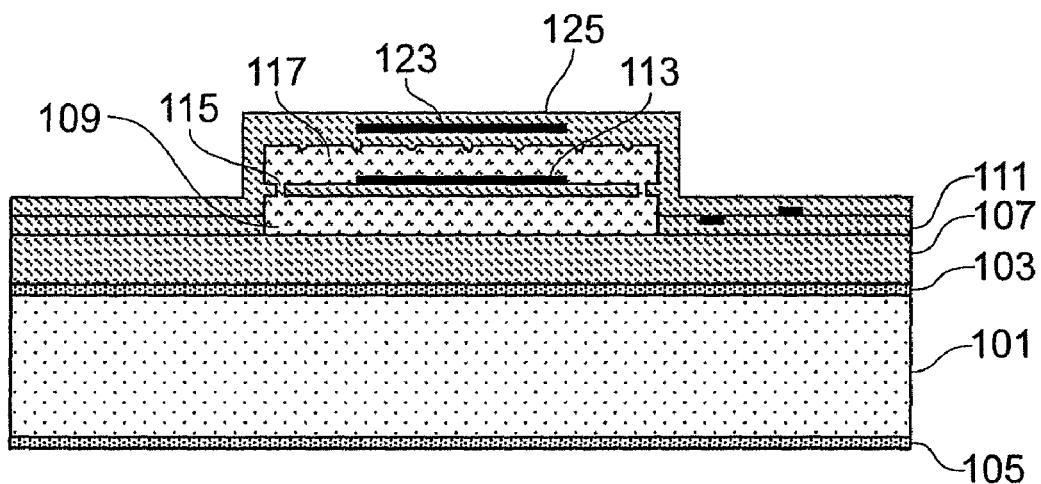
Figure 14B:
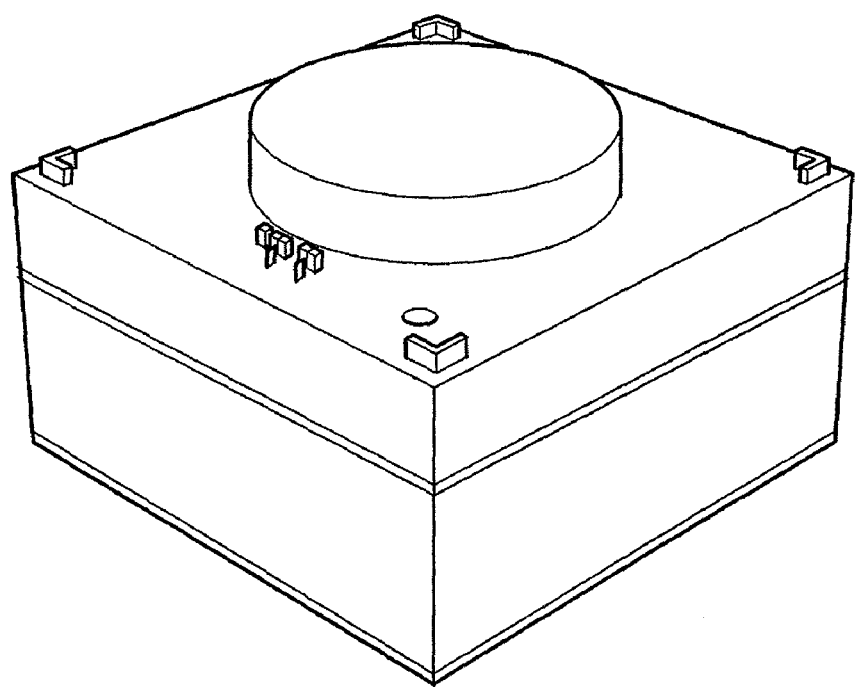

Next, in FIG. 14, the remainder of the back-plate is formed by depositing an upper silicon nitride back-plate layer 125. As above, the upper silicon nitride back-plate layer 125 can be deposited using a PECVD process at 300° C. The upper silicon nitride back-plate layer 125 has a thickness, for example, of between 2.1 um to 2.3 um, for example 2.2 um, and a tensile stress of between 125 to 175 MPa, for example 150 MPa.

The lower and upper silicon nitride back-plate layers 121, 125 define the structurally rigid back-plate 14 of FIG. 2 that supports the second electrode 123. The back-plate is configured to have a greater measure of stiffness than the membrane, for example a measure of stiffness that is ten times greater than that of the membrane. It will be appreciated that references to the back-plate 14 having a greater measure of stiffness than the membrane is intended to include a combination of thickness and stress, i.e. in addition to stress per se.

Figure 15:
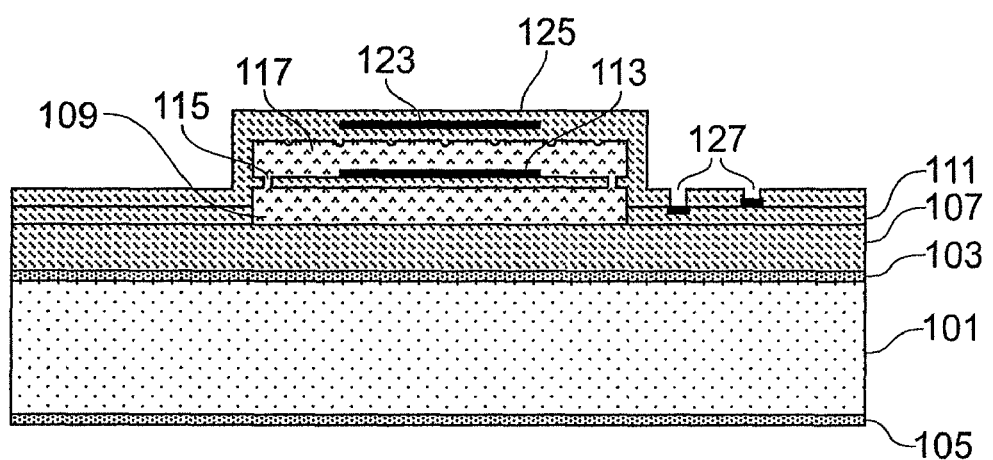

In FIG. 15, pad connection holes 127 are etched in the upper silicon nitride layer 125 to provide connectivity to pads of the electrode tracks of the first and second electrodes 113, 123. Additional holes may also be etched at this stage, for example to provide connectivity to the silicon substrate 101, or other regions of the MEMS device.

Figure 16A:
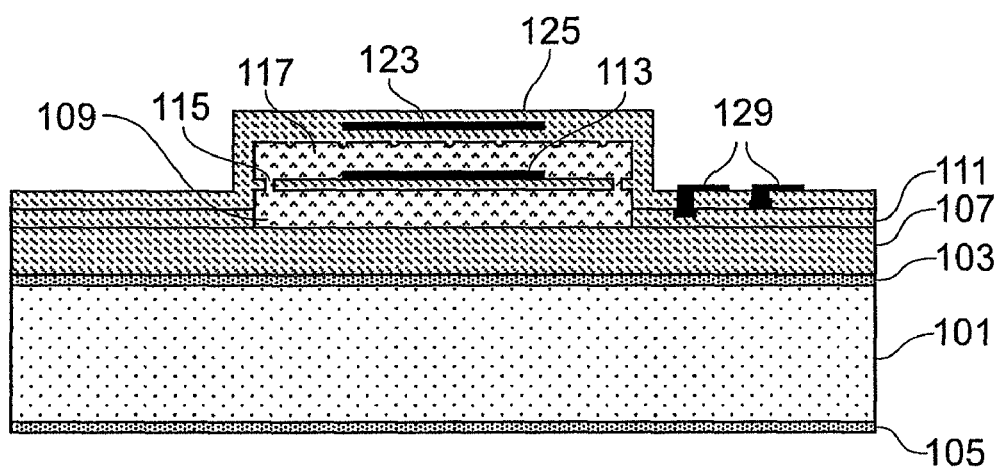
Figure 16B:
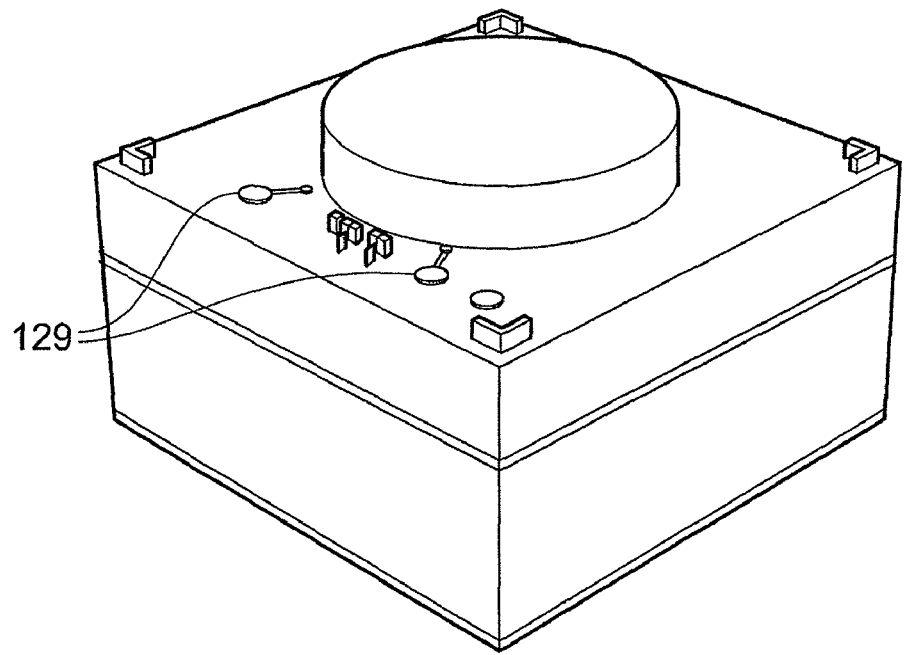

Next, in FIG. 16a, a pad thickening mask 129 is applied, for example using a Ti/Al deposition having a thickness of between 0.95 um to 1.05 um, for example 1 um. The titanium is used for adhesion purposes. This involves first depositing a titanium layer of 50 nm, for example, and then the remainder of the aluminium. FIG. 16b shows a perspective view of FIG. 16a. The pad thickening mask 129 is applied to improve the strength of the respective pads.

Figure 17A:
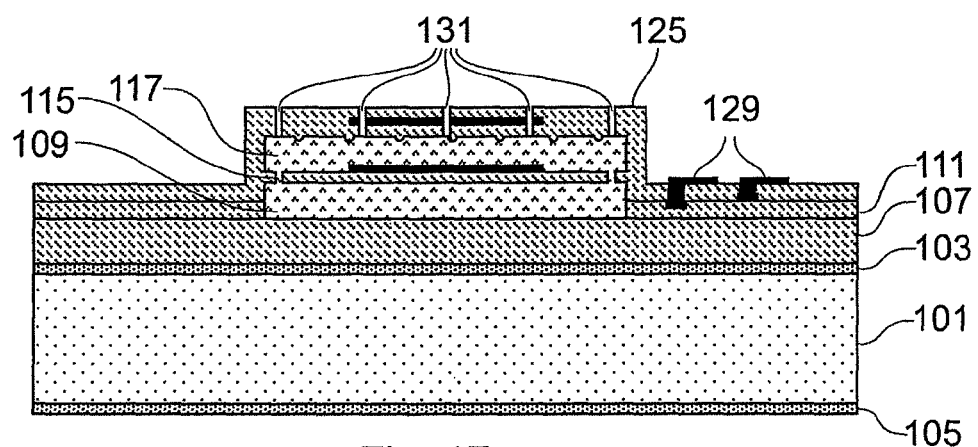

As shown in FIG. 17a, a plurality of acoustic holes 131 are then formed in the upper silicon nitride back-plate layer 125. The acoustic holes 131 extend to the second sacrificial layer 117. When using a second electrode as shown in FIGS. 13a and 13b, this involves the step of etching though the upper silicon nitride back-plate layer 125 and second electrode 123 in the region of the second electrode 123. However, as will be appreciated from the further discussions of the second electrode 123 below, the etching of the second electrode 123 can be avoided at this stage when the electrode is formed with pre-existing holes, as discussed with reference FIG. 20.

During the fabrication process the acoustic holes 131 allow the second sacrificial layer 117 (and parts of the first sacrificial layer 109 through the bleed holes 115) to be etched from above the wafer. During use of the microphone device, i.e. after the removal of the sacrificial layers, the acoustic holes 131 allow sound waves to pass to the membrane.

Figure 17B:
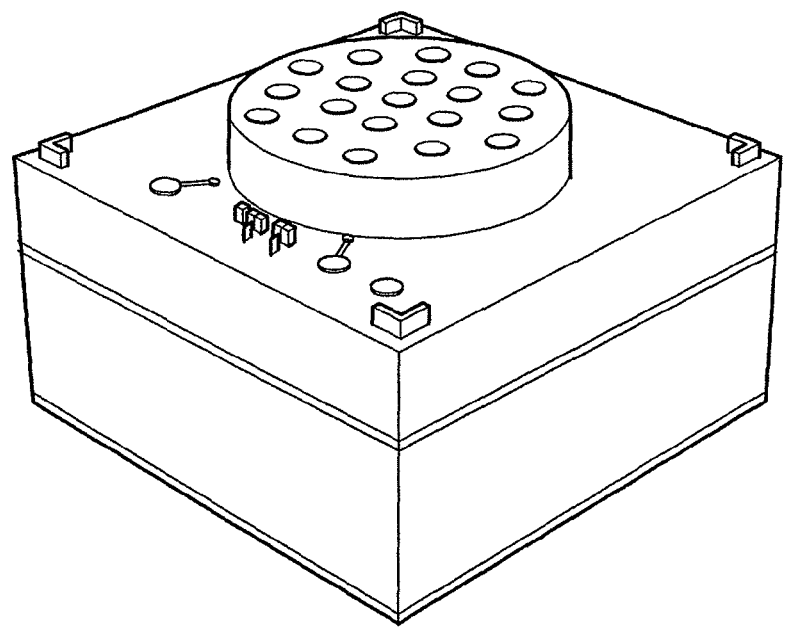

The acoustic holes 131 have a diameter, for example, of about 5 um, and a spacing, for example, of about 15 um. FIG. 17b shows a perspective view of the arrangement of the acoustic holes 131. It will be appreciated that either fewer or additional holes may be provided.

Figure 18A:
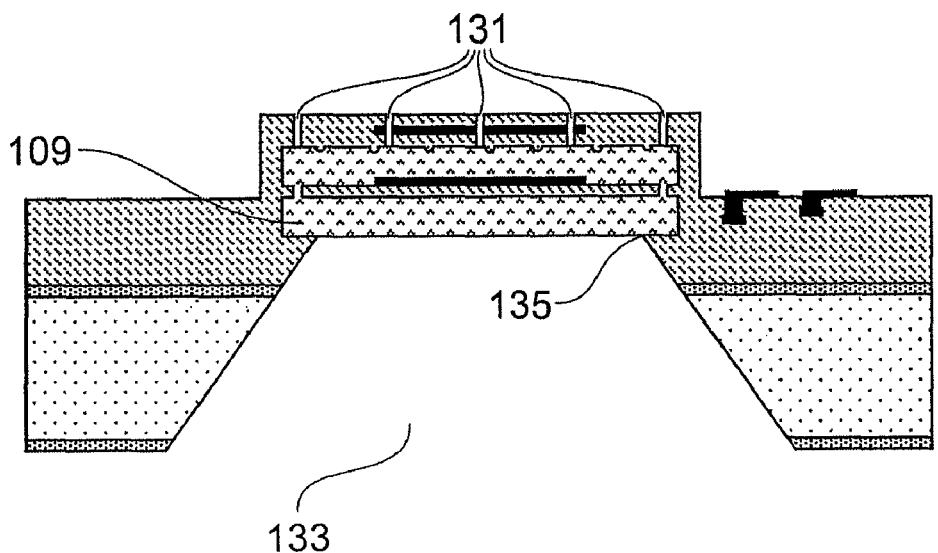

Referring to FIG. 18a a back-volume 133 is then formed by etching from underneath the substrate. The etching may be performed using a wet-etch up to the silicon nitride dielectric layer 107 which acts as a first etch stop. The wet etch involves patterning the back of the wafer with resist, and this pattern is then transferred to the silicon nitride dielectric layer 107 on the back of the wafer and which is not attacked by the wet etch chemical. The mask pattern will typically be square and aligned to the wafer crystal planes. The wet etch is performed using an aqueous solution of 22% tetramethylammonium hydroxide (TMAH) and 78% water and results in a smaller but square opening at the membrane. A person skilled in the art will also appreciate that the wet etch process could be performed with Potassium Hydroxide. A further etch is then performed through the silicon nitride dielectric layer 107 to the first sacrificial layer 109 which acts as a polyimide etch stop.

Figure 18B:
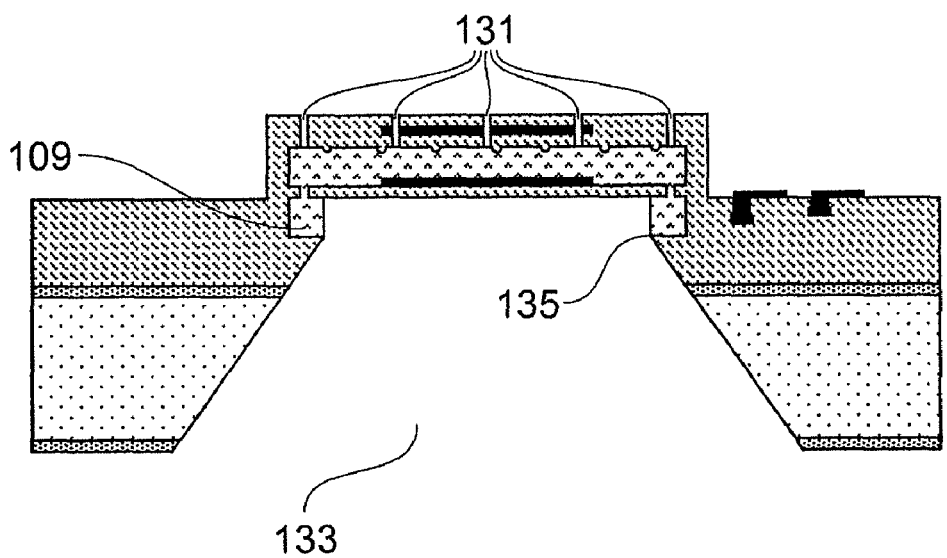
Figure 19:
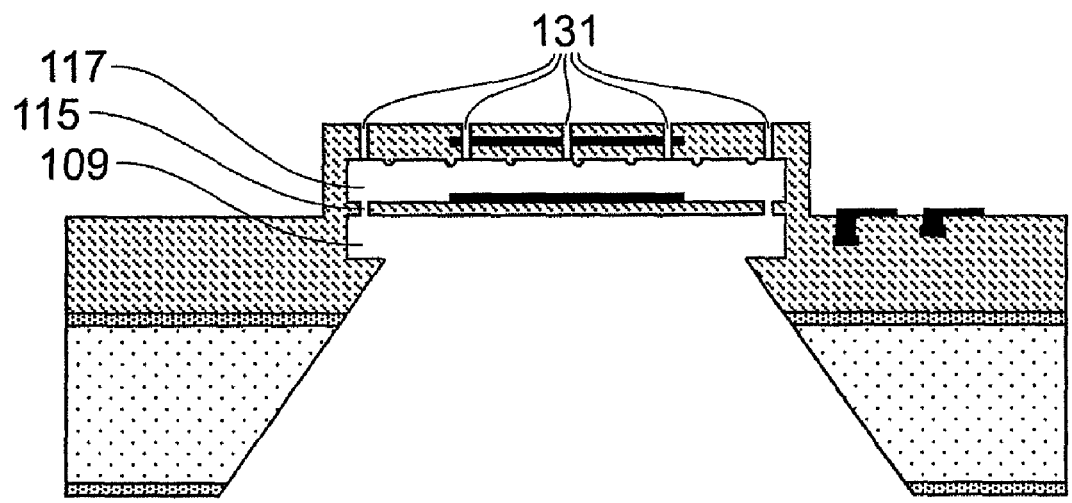

Once the back-volume 133 has been etched as described above, the inner area of the first sacrificial layer 109 may then be etched from below the wafer, i.e. in a direction away from the substrate and towards the first sacrificial layer 109, as shown in FIG. 18b. The inner area of the first sacrificial layer 109 corresponds to the pattern transferred to the silicon nitride dielectric layer 107. The area of the back volume 133 in a plane where the back volume 133 meets the first sacrificial layer 109 is smaller than the area of the first sacrificial layer 109 at said plane. As will be appreciated by a person skilled in the art, the process of etching a back-volume 133 of this size leads to a natural tapering in the back-volume (i.e. the square shape of the mask pattern becomes smaller as the etch moves towards the etch-stop, thereby creating a pyramid shape). However, as mentioned above, since the diameter of the membrane is effectively defined by the outer diameter of first sacrificial layer 109 (in conjunction with the outer diameter of the second sacrificial layer 117), the degree to which the back-volume tapers during the wet etch process is irrelevant, since the area of the back-volume near the point where the back-volume meets the first sacrificial layer 109, i.e. near point 135 in FIG. 18, does not contribute to the definition of the diameter of the membrane. Instead, the diameter of the membrane is defined by the subsequent removal of the remaining portions, i.e. outer area, of the first sacrificial layer 109. This is described in relation to FIG. 19 below.

As an alternative to the wet etch process, a dry etch may be used to form the back-volume 133, whereby the substrate is patterned with relatively thick (8 um) resist and dry etched using a $SF_6/C_4F_8$ gas combination in a reactive ion etch using a Surface Technology Systems Inductively Coupled Plasma (STS ICP) machine. The dry etch can be used to provide a back-volume having a diameter, for example, of about 900 nm. Although not as significant as the tapering of the wet etch process, the dry etch process also exhibits a reduction in the diameter of the back-volume as it extends through the substrate, and through the silicon nitride dielectric layer 107 towards the first sacrificial layer 109. However, as mentioned above, since the diameter of the membrane is effectively defined by the outer diameter of first sacrificial layer 109, the degree to which the back-volume tapers during the dry etch process is irrelevant, since the diameter of the back-volume near the point where the back-volume meets the first sacrificial layer 109, i.e. near point 135 in FIG. 18a, does not define the diameter of the membrane. Instead, the diameter of the membrane is defined by the subsequent removal of the remaining portions, i.e. outer area, of the first sacrificial layer 109 as described below.

In order to protect the wafer during the etching processes described above, and in particular the wet etch process, a protective layer (not shown) may be placed over the upper silicon nitride back-plate layer 125 prior to performing the back-etching. The protective layer acts to protect the front side of the wafer during the back-etch process. As well as protecting the wafer from damage during the back-etch process, the protective layer also prevents the acoustic holes 131 from being clogged by any debris that might be produced during a singulation process (also described below).

Once the back-volume has been etched as described in FIG. 18a above, and the inner area of the first sacrificial layer 109 etched as described in FIG. 18b, the remainder (i.e. outer area) of the first sacrificial layer 109 and the whole of the second sacrificial layer 117 may then be removed by performing a front-etch, i.e. from above the wafer.

However, prior to removal of the remainder of the first sacrificial layer 109 and the whole of the second sacrificial layer 117 in this way, the wafer is first placed on a carrier, for example dicing tape, for singulation. Other carriers may also be used, for example a glass carrier in combination with adhesive tape.

When the MEMS microphones are formed in large numbers on a substrate, i.e. wafer, the substrate containing the MEMS microphones is diced up so that there is only one device (or a functional group of devices) per diced piece, in a process known as singulation. Note that in this context a device comprises one or more MEMS transducer (and possibly circuit regions) as described above. This embodiment of the method is advantageous in that the second sacrificial layer 117 and remainder of the first sacrificial layer 109 provide mechanical support for the delicate membrane structures during singulation. The protective layer prevents the acoustic holes 131 from being clogged or damaged by any debris that may be produced during the singulation process.

The method of singulating the substrate can be one of the following: dicing with a high speed diamond blade; laser cutting; or scribing the substrate and cleaving the substrate along a crystallographic orientation. The substrate is typically attached to a high temperature dicing tape. The dicing tape may be any adhesive tape suitable to survive the process in which the second sacrificial layer 117 and remainder of the first sacrificial layer 109 are removed. During singulation, the intact second sacrificial layer 117 (and outer portions of the first sacrificial layer 109) provide strength and protection to the membrane, while the protective layer prevents the acoustic holes 131 from becoming clogged by debris resulting from the singulation process. After singulation, there is only one device per diced piece, or multiple devices when producing device arrays.

The singulated substrate, still on the dicing tape, is processed using a dry etch process from above the wafer (for example an oxygen plasma system) to remove the protective layer, the second sacrificial layer 117 and the remaining portions of the first sacrificial layer 109. For example, an oxygen plasma introduced through the acoustic holes 131 will etch through to the second sacrificial layer 117, and also through the bleed holes 115 to remove the remaining sections of the first sacrificial layer 109. During this process oxygen is introduced into a chamber in which the substrate is placed and a plasma set up. The oxygen in the plasma reacts with the organic sacrificial layer to form volatile oxides which can then be removed from the chamber.

Typically the conditions used for this process are a temperature of 150° C. in an oxygen plasma for approximately 3 hours (40% $O_2$, radiofrequency power 350 W, magnetic field 660 mT). However, a person skilled in the art will appreciate that any conditions suitable to remove the polyimide sacrificial layers may be envisaged.

Therefore, as will be appreciated from the above, the bleed holes 115 aid with the removal of the first sacrificial layer 109 during the fabrication process. In addition, the bleed holes 115 allow a restricted air flow to pass between the cavity created by the second sacrificial layer 117 and the cavity created by the first sacrificial layer 109 and the back-volume 133. This results in an improved performance at low frequency.

According to another aspect of the invention, the individual devices can be tested while they are still on the dicing tape, but after they have been singulated, and after the sacrificial layers have been removed. This enables the substrates to be tested in mass production, rather than having to mount each individual device into a carrier for testing.

The finished MEMS microphones are removed from the dicing tape and mounted in a package (not shown). This may be achieved using an automated pick and place system that lifts a microphone chip from the dicing tape and places it in the package suitable for electrical connection to any device operable to interface with the microphone.

In addition to the process and sequence described above for removing the first and second sacrificial layers, it is noted that other processes and sequences may also be adopted within the scope of the invention.

For example, the wafer may be placed on a dicing tape after the process of etching the back-volume 133 as described in FIG. 18a, but before removing any of the first sacrificial layer 109. The wafer may then be singulated with both the first and second sacrificial layers 109, 117 intact. The first and second sacrificial layers 109, 117 may then be removed by etching from above the wafer, i.e. through the acoustic holes 131, the second sacrificial layer 117, the bleed holes 115 and finally the first sacrificial layer 109. Alternatively, the dicing tape can be perforated such that the inner portion of the first sacrificial layer 109 is etched from below the wafer (as described in FIG. 18b), with the second sacrificial layer 117 and the outer area of the first sacrificial layer 117 being etched from above the wafer (i.e. as described in FIG. 19).

As an alternative to perforating a dicing tape, the carrier may comprise a glass carrier or a silicon wafer carrier having predefined channels, trenches, protrusions or other structures for allowing the sacrificial layer to be etched from underneath via the back volume after being placed on the carrier. In other words, according to this arrangement the predefined channels, trenches, protrusions or other structures enable the etch material or gas to access the back volume, and hence the inner area of the first sacrificial layer. As an alternative, or in addition to the carrier having such channels, trenches, protrusions or other structures, it is noted that these could also be placed on the substrate itself for allowing the etch material or gas to access the back volume while the substrate is located on the carrier.

The invention also encompasses the first and second sacrificial layers being removed by etching both the first and second sacrificial layers from below the wafer, i.e. in a direction from the substrate towards the first sacrificial layer 109. In such an arrangement the second sacrificial layer is etched via the back volume 133 and bleed holes 115.

Figure 20:
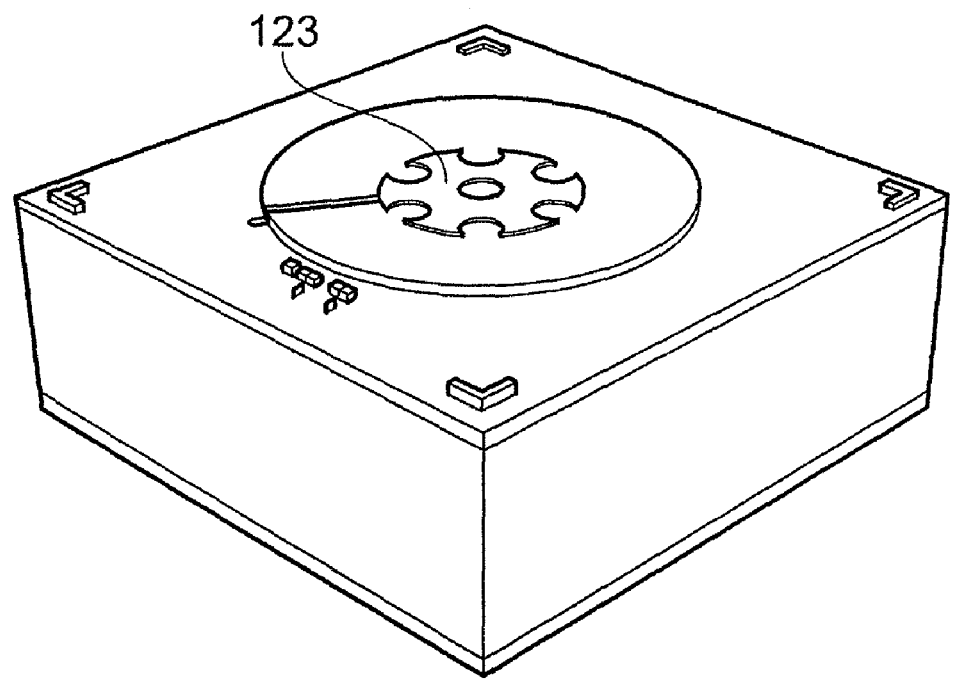
FIG. 20 shows an electrode according to another aspect of the present invention.

According to another aspect of the present invention as shown in FIG. 20, the second electrode 123 may be deposited with a predetermined pattern. The predetermined pattern may comprise one or more openings or holes corresponding to the position of one or more openings in the back-plate i.e. the acoustic holes 131 for enabling sound waves to pass to the second cavity 17 of FIG. 2. In other words, by forming the second electrode using a predetermined pattern, the etching process described in FIG. 17a for forming the acoustic holes 131 only needs to etch through silicon nitride, rather than through silicon nitride and the second electrode. This simplifies the etching process. Furthermore, the diameter of the preformed holes in the electrode can be made larger than the diameter of the acoustic holes. This has the advantage of encapsulating the second electrode, and hence protecting the device from moisture during use. It is noted that the electrode coupled to the membrane may also be encapsulated in a similar manner for protection during use. In other words, if the membrane comprises a sandwiched electrode, with the membrane having one or more holes corresponding to one or more holes in the sandwiched electrode, at least one of the holes in the electrode can be made larger than a corresponding holes in the membrane, thus encapsulating the electrode.

Figure 21A:
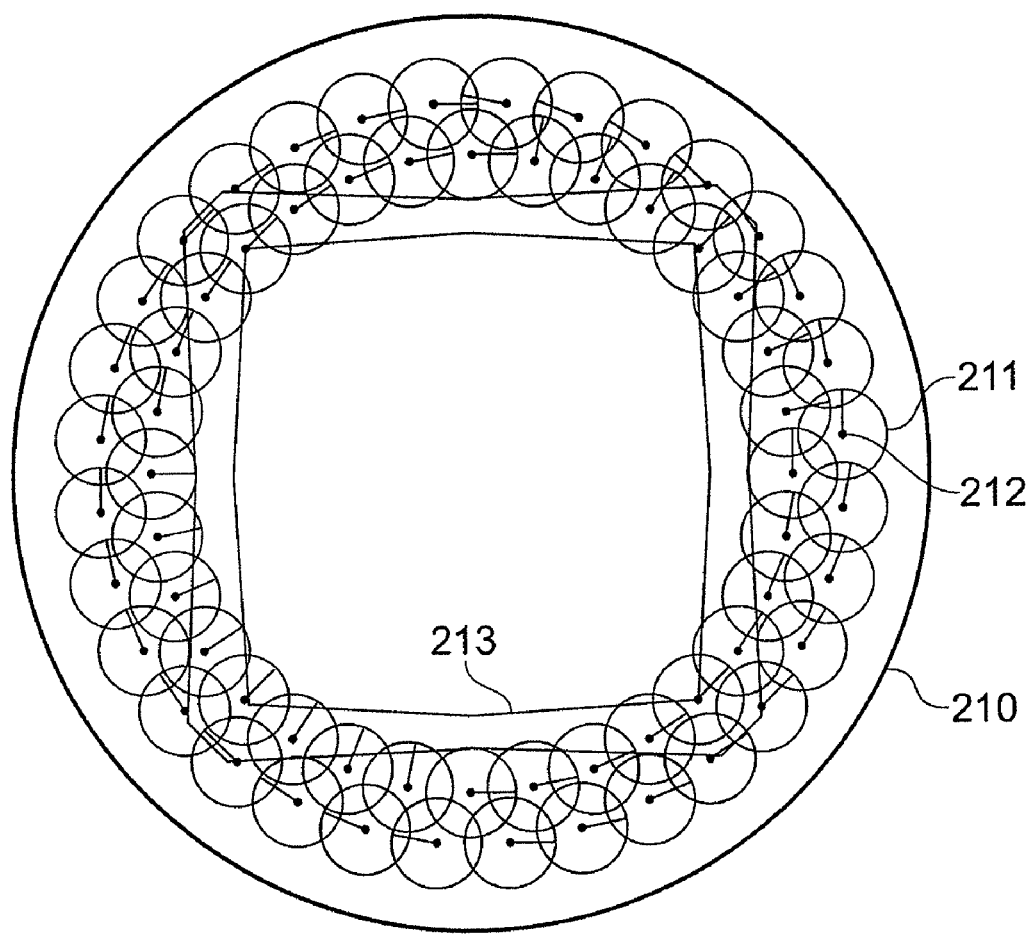
FIGS. 21a, 21b and 21c illustrate the positioning of bleed holes.
Figure 21B:
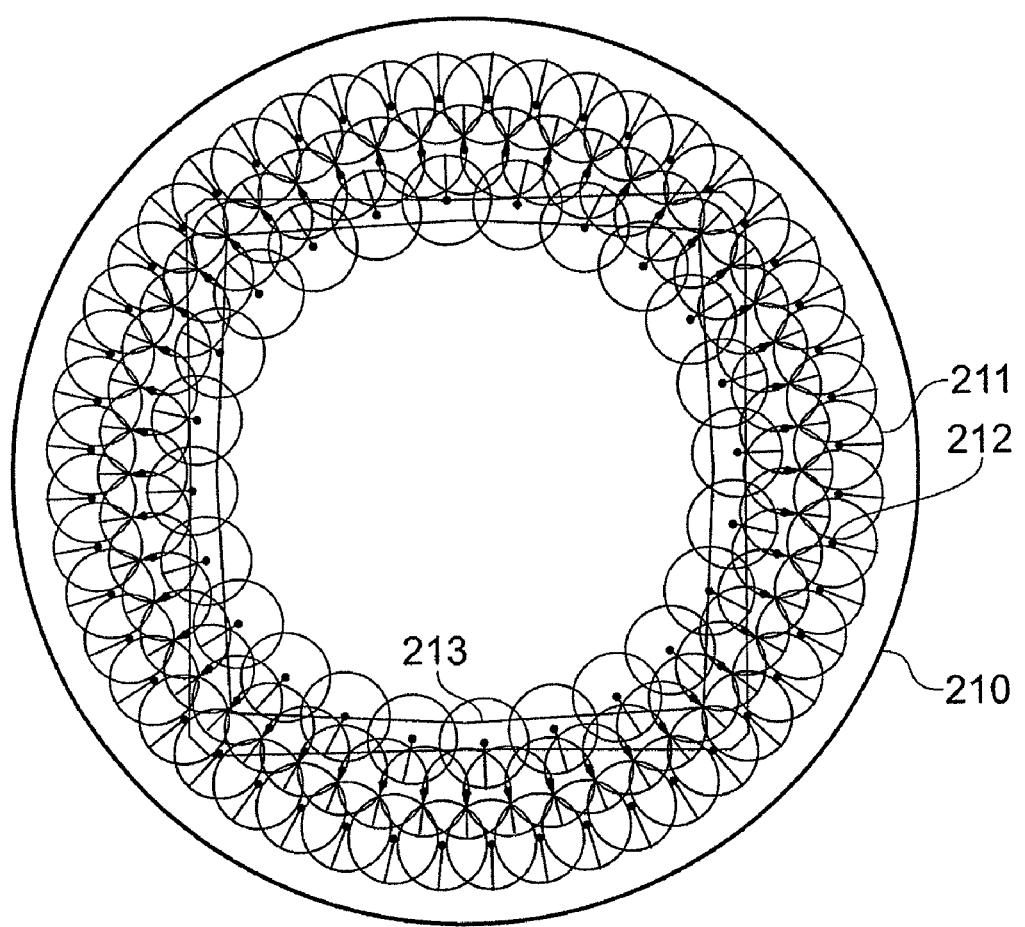
Figure 21C:
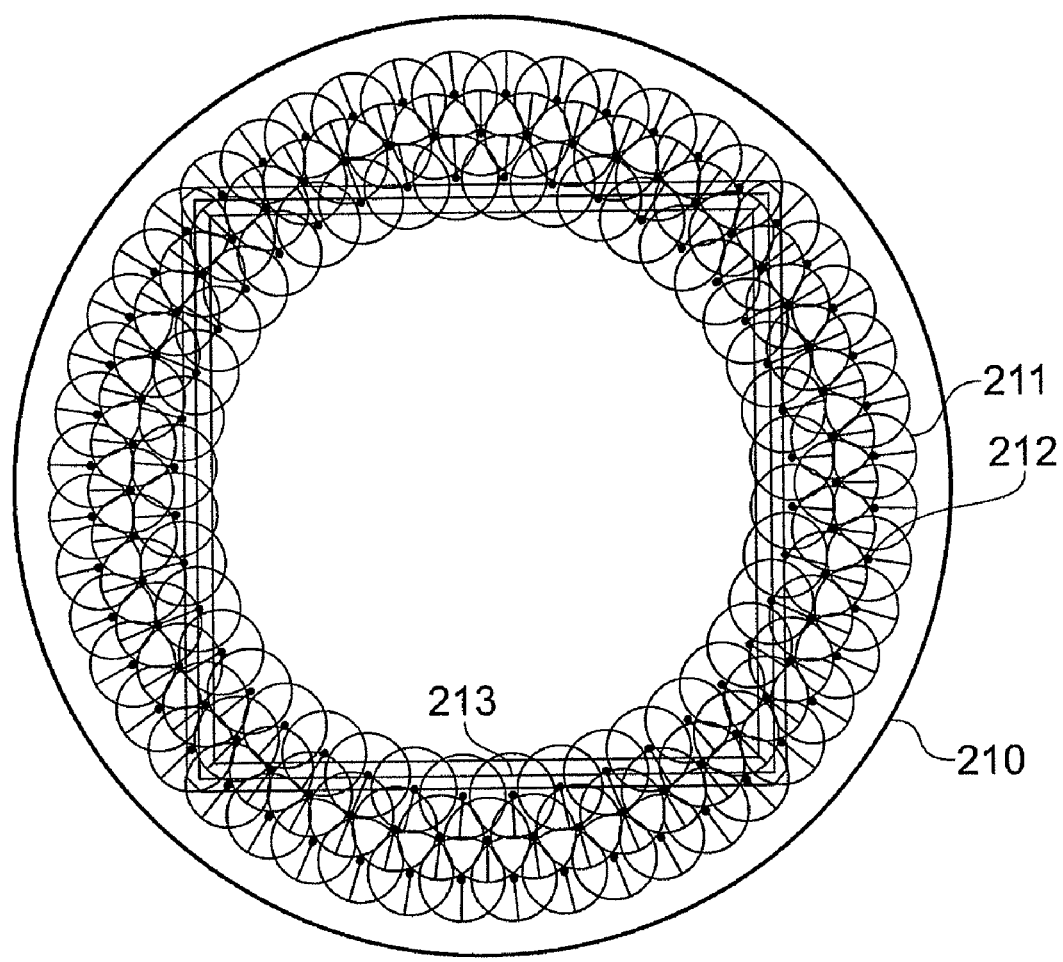

FIGS. 21a, 21b and 21c illustrate in greater detail the arrangement of the bleed holes 115, and in particular the positioning of the bleed holes 115 in relation to the boundary or outer perimeter of the first sacrificial layer 109 and the back volume 133. FIG. 21a shows a MEMS device having 64 bleed holes, FIG. 21b a MEMS device having 120 bleed holes, and FIG. 21c a MEMS device having 136 bleed holes. Referring to FIG. 21a, the bleed holes 212 are arranged on first and second concentric circles near the periphery 210 of the first sacrificial layer. Each of the bleed holes 212 etches an area 211. The bleed holes 212 are arranged such that the areas 211 overlap one another, thereby enabling the outer area of the sacrificial layer to be etched away. The lines 213 represent the area of the back volume at the plane where the back volume meets the first sacrificial layer. The lines 213 represent the margin of error that is introduced by the back-etch process. The back-volume shown in FIG. 21a (i.e. having a substantially square cross-section) is formed from a wet-etch process. It will be appreciated that a back-volume produced using a dry-etch process will result in a generally circular area.

FIG. 21b shows 120 bleed holes 212 arranged on three concentric circles, while FIG. 21c shows 136 bleed holes 212 arranged in three concentric circles.

It is noted that the precise number and positioning of the bleed holes 212 is selected in order to tune the operating characteristics of the device, for example the low frequency response of the device. There is a trade off between too many holes affecting the low frequency roll-off, and too few holes preventing a proper etching process. In addition, it is noted that the performance of the device may be tuned according to the electronic circuitry that interfaces with the device, or vice versa.

According to a further aspect of the invention, although the first electrode 113 is shown as being deposited on top of the membrane, i.e. the silicon nitride diaphragm layer 111, the first electrode 113 may also form an integral part of the membrane, or be located on the underside of the membrane. Such arrangements prevent deformation of the membrane.

It is noted that the problem of reducing the temperature dependence and increasing the sensitivity of a MEMS microphone is addressed in the exemplary embodiment by carefully controlling the stress in the membrane and closely matching the combined thermal expansion coefficient of the membrane and the first electrode with that of silicon. This is described in further detail in co-pending PCT application PCT-06-019. This is done because differences in the thermal coefficient of expansion of the membrane and the substrate give rise to a temperature dependent stress in the membrane. As the sensitivity of the device is inversely proportional to membrane stress, the sensitivity can be maximised by choosing a relatively low membrane stress. However, in previously known devices a small change in temperature can result in a large change in sensitivity or the membrane tension may be completely released thus rendering the device useless. The membrane structure of the first embodiment seeks to address this problem.

Firstly, process parameters for deposition of the silicon nitride diaphragm layer 111 are carefully chosen to control its resultant stress. Aluminium is deposited and patterned to form the resultant first electrode 113 structure. The process parameters are chosen to control the tensile stress of the deposited membrane 111 so that the tensile stress is in the range 40-50 MPa. As the silicon substrate has a thermal expansion coefficient which is typically greater than that of the silicon nitride, the tension of the membrane increases with an increase in temperature for a silicon nitride membrane in the absence of a deposited electrode. In contrast, aluminium and other candidate electrode materials exhibit a higher thermal expansion coefficient than silicon. The exemplary embodiment thus uses a composite membrane in which the combined thermal expansion coefficient of the membrane plus the electrode is more closely matched to the thermal expansion coefficient of silicon. Typical material properties for the preferred materials are listed in table 1 from P. R. Scheeper "A silicon condenser microphone: materials and technology", ISBN 90-9005899-0, pg. 54.

TABLE 1

|  | Expansion coefficient ($\times 10^{-6}/°$ C.) | Young's Modulus E (GPa) |
| --- | --- | --- |
| Silicon | 3.2 | 180 |
| Silicon Nitride | 1.5 | 110 |
| Aluminium | 24.5 | 70 |

To estimate the respective thickness of the membrane 111 and the first electrode 113 an approximation to the thickness ratio of aluminium ($t_{al}$) to silicon nitride ($t_{sn}$) can be found to be given by $$\frac{t_{al}}{t_{sn}} \approx \frac{(E_{sn}/(1-\nu_{sn}))(\alpha_{sn}-\alpha_{si})}{(E_{al}/(1-\nu_{al}))(\alpha_{si}-\alpha_{al})}$$

Here, t is the thickness of the structural element, E is Young's modulus, $\alpha$ is the thermal expansion coefficient, $\nu$ is Poisson's ratio and the subscripts al, sn and si denote the materials used in this example i.e. aluminium, silicon nitride and silicon respectively. This implies that the first electrode 113 thickness should be approximately a seventh of the silicon nitride membrane 111 thickness. A more accurate estimation is obtained using numerical simulation taking into account the electrode area and the respective Poisson's ratio of each of the materials. As exact material parameters can depend on the specific processing conditions, these are thus determined experimentally. To avoid bowing due to differential layer stresses a sandwich of either metal/nitride/metal or nitride/metal/nitride can also be employed. In order to ensure optimum sensitivity in the exemplary embodiment, the back plate is typically more than ten times stiffer than the membrane 111. To avoid the back-plate becoming too thick, the back-plate may be fabricated with a higher stress than that of the membrane 111.

Although not shown in the embodiments above, the sensitivity of the microphone may be rendered relatively independent of changes in temperature by the addition of controlled stress release structures that are etched in the region of the outer perimeter of a membrane, as described in co-pending PCT application PCT-07-019. The controlled stress release structures effectively reduce the Young's modulus of this region.

Furthermore, the membrane may be attached to a structurally strong back plate which is itself stress decoupled from the substrate, which is also described in further detail in co-pending PCT application PCT-07-019.

A person skilled in the art will appreciate that the above description of the preferred embodiment is not limited to the fabrication of MEMS microphones. For example, the method described in the embodiment may be modified so that the step of etching a hole in the underside of the substrate is omitted (or reduced) from the process so as to fabricate an ultrasonic transducer. This could involve making the back-plate thinner such that it becomes moveable by applying a voltage across the two electrodes. Re-sealing of the holes would allow operation also as an immersion transducer. Again without the back-volume and with a re-sealed membrane the capacitance will become sensitive to absolute pressure rather than differential pressure. Furthermore, the method described in the embodiment above may be used to fabricate a pressure sensor or fabricate an array on a substrate, the array comprising any or all of: a microphone; an ultrasonic transducer; and a pressure sensor. The array, combined with appropriate electronics and signal processing could provide a directionally selective microphone.

The invention is also applicable to other MEMS transducers, such as accelerometers having a mass located on the membrane.

Although the embodiments have been described in relation to the membrane moving in response to pressure differences, and in particular pressure differences caused by sound waves, the membrane may also be configured to move in response to absolute pressure.

It is also noted that although the embodiments described above are in relation to the sacrificial material being a polyimide, it is noted that the sacrificial material may include other organic materials including, but not limited to, polyacrylate, polyamide, polycarbonate and polyethylene terapthalate. The first and second sacrificial layers may also be made from different materials.

In addition, it will be appreciated that the deposition of the various layers may be made in a different sequence, or in a different order. For example, the first electrode may be deposited on the underside of the membrane, rather than above the membrane as shown in the embodiment. Also, the first sacrificial layer may be formed by etching a recess in the silicon nitride layer, and depositing the sacrificial layer in the recess (i.e. as opposed to depositing the first sacrificial layer on top of the silicon nitride layer). Furthermore, it is noted that one or more layers may be omitted from the process.

Additional layers may also be incorporated, for example an environmental barrier may be provided for preventing moisture or other unwanted materials from entering the device.

Furthermore, other forms of wet and dry etch processes may be used as alternatives to the processes described above. For example, the plasma oxygen may be mixed with one or more of the following gases: SF6, CF4, CH2F2, H2, Ar, C4F8, C2F6, CFH3.

It is noted that the invention may be used in a number of applications. These include, but are not limited to, consumer applications, medical applications, industrial applications and automotive applications. For example, typical consumer applications include laptops, mobile phones, PDAs and personal computers. Typical medical applications include hearing aids. Typical industrial applications include active noise cancellation. Typical automotive applications include hands-free sets, acoustic crash sensors and active noise cancellation.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

This application claims priority to United Kingdom Application No. 0605576.8, filed Mar. 20, 2006, the entire disclosure of which is incorporated herein by reference.

The invention claimed is:

1. A micro-electrical-mechanical system (MEMS) capacitive microphone comprising:
   first and second electrodes;
   a membrane that it is mechanically coupled to the first electrode; and
   a back plate that it is mechanically coupled to the second electrode;
   wherein the second electrode comprises one or more openings.

2. A micro-electrical-mechanical system (MEMS) capacitive microphone as claimed in claim 1, wherein the one or more openings correspond to one or more openings formed in the back plate.

3. A micro-electrical-mechanical system (MEMS) capacitive microphone as claimed in claim 2, wherein at least one of the openings in the second electrode is larger than a corresponding opening in the back plate.

4. A micro-electrical-mechanical system (MEMS) capacitive microphone as claimed in claim 1, wherein the membrane comprises one or more openings corresponding to one or more openings in the first electrode.

5. A method as claimed in claim 4, wherein at least one of the openings in the first electrode is larger than a corresponding opening in the membrane.

6. A micro-electrical-mechanical system (MEMS) capacitive microphone comprising:
   first and second electrodes;
   a membrane that it is mechanically coupled to the first electrode; and
   a back plate that it is mechanically coupled to the second electrode;
   wherein the first and second electrodes each have a diameter that is different to the diameter of the membrane.

7. A micro-electrical-mechanical system (MEMS) microphone as claimed in claim 6, wherein the diameters of the first and second electrodes are substantially equal.

8. An electronic device comprising a micro-electrical-mechanical system (MEMS) microphone as claimed in claim 6.

9. A communications device comprising a micro-electrical-mechanical system (MEMS) microphone as claimed in claim 6.

10. A portable telephone device comprising a micro-electrical-mechanical system (MEMS) microphone as claimed in claim 6.

11. An audio device comprising a micro-electrical-mechanical system (MEMS) microphone as claimed in claim 6.

12. A computer device comprising a micro-electrical-mechanical system (MEMS) microphone as claimed in claim 6.

13. A vehicle comprising a micro-electrical-mechanical system (MEMS) microphone as claimed in claim 6.

14. A medical device comprising a micro-electrical-mechanical system (MEMS) microphone as claimed in claim 6.

15. An industrial device comprising a micro-electrical-mechanical system (MEMS) microphone as claimed in claim 6.

16. A micro-electrical-mechanical system (MEMS) microphone as claimed in claim 6, wherein the diameters of the first and second electrodes are smaller than the diameter of the membrane.

17. A micro-electrical-mechanical system (MEMS) microphone as claimed in claim 16, wherein the diameters of the first and second electrodes are less than 90% of the diameter of the membrane.

18. A micro-electrical-mechanical system (MEMS) microphone as claimed in claim 16, wherein the diameters of the first and second electrodes are less than 80% of the diameter of the membrane.

19. A micro-electrical-mechanical system (MEMS) microphone as claimed in claim 16, wherein the diameters of the first and second electrodes are between 50-70% of the diameter of the membrane.

20. A micro-electrical-mechanical system (MEMS) microphone comprising:
   a substrate;
   first and second electrodes;
   a membrane that it is mechanically coupled to the first electrode; and
   a back plate that it is mechanically coupled to the second electrode;
   and further comprising:
   a first cavity beneath the membrane, the first cavity formed using a first sacrificial layer; and
   a second cavity between the first and second electrodes, the second cavity formed using a second sacrificial layer.

21. A micro-electrical-mechanical system (MEMS) microphone as claimed in claim 20, further comprising a third cavity, the third cavity connecting with the first cavity to form a back volume.

22. A micro-electrical-mechanical system (MEMS) microphone as claimed in claim 21, wherein the third cavity is formed such that the area of the third cavity at a plane where the third cavity meets the first cavity is smaller than the area of the first cavity, such that the area of the third cavity in said plane falls substantially within the perimeter of the first cavity.

23. A micro-electrical-mechanical system (MEMS) microphone as claimed in any one of claims 20, further comprising a plurality of openings in the material of the membrane, the plurality of openings connecting the first cavity and the second cavity.

24. A micro-electrical-mechanical system (MEMS) microphone as claimed in claim 23, wherein the plurality of openings are located in an outer area of the first cavity, the outer area of the first cavity being outside the area defined by the third cavity at the plane where the third cavity meets the first cavity.

25. A micro-electrical-mechanical system (MEMS) microphone as claimed in claim 24, wherein said openings are formed on one or more concentric circles in the outer area of the first cavity.

26. A micro-electrical-mechanical system (MEMS) microphone as claimed in claim 23, wherein the plurality of openings are arranged such that an area etched through a first opening substantially overlaps an area etched through an adjacent opening.

27. A micro-electrical-mechanical system (MEMS) microphone as claimed in claim 26, wherein the openings having a spacing of less than 100 um.

28. A micro-electrical-mechanical system (MEMS) microphone as claimed in claim 20, wherein the first and second electrodes each have a diameter that is different to the diameter of the membrane.

29. A micro-electrical-mechanical system (MEMS) microphone as claimed in claim 28, wherein the diameters of the first and second electrodes are smaller than the diameter of the membrane.

30. A micro-electrical-mechanical system (MEMS) microphone as claimed in claim 29, wherein the diameters of the first and second electrodes are less than 90% of the diameter of the membrane.

31. A micro-electrical-mechanical system (MEMS) microphone as claimed in claim 29, wherein the diameters of the first and second electrodes are less than 80% of the diameter of the membrane.

32. A micro-electrical-mechanical system (MEMS) microphone as claimed in claim 29, wherein the diameters of the first and second electrodes are between 50-70% of the diameter of the membrane.

33. A micro-electrical-mechanical system (MEMS) microphone as claimed in claim 28, wherein the diameters of the first and second electrodes are substantially equal.

34. A micro-electrical-mechanical system (MEMS) microphone as claimed in claim 20, further comprising a plurality of openings in the back plate.

35. A micro-electrical-mechanical system (MEMS) microphone as claimed in claim 34, wherein at least some of the openings in the back plate pass through the second electrode.

36. A micro-electrical-mechanical system (MEMS) microphone as claimed in claim 20, further comprising one or more dimples on an inner surface of the back plate.

37. A micro-electrical-mechanical system (MEMS) microphone as claimed in claim 20, further comprising one or more dimples on a surface of the membrane.

38. A micro-electrical-mechanical system (MEMS) microphone as claimed in claim 37, wherein the one or more dimples are located on a surface of the membrane facing the first cavity, and on the outer area of the membrane, the outer area of the membrane being outside the area defined by the third cavity at the plane where the third cavity meets the first cavity.

39. A micro-electrical-mechanical system (MEMS) microphone as claimed in claim 20, further comprising electronic circuitry on the same substrate as the MEMS microphone.

40. A micro-electrical-mechanical system (MEMS) microphone as claimed in claim 20, further comprising one or more electrical interface pads for connection to external electronic circuitry.

* * * * *